US010826533B2

(12) United States Patent
Li et al.

(10) Patent No.: US 10,826,533 B2
(45) Date of Patent: Nov. 3, 2020

(54) METHODS, SYSTEMS, AND COMPUTER-READABLE MEDIA FOR DECODING A CYCLIC CODE

(71) Applicant: CHONGQING UNIVERSITY OF POSTS AND TELECOMMUNICATIONS, Chongqing (CN)

(72) Inventors: Yong Li, Chongqing (CN); Hsin-Chiu Chang, Kaohsiung (CN); Qianbin Chen, Chongqing (CN); Trieu-Kien Truong, Kaohsiung (CN)

(73) Assignee: CHONGQING UNIVERSITY OF POSTS AND TELECOMMUNICATIONS, Chongqing (CN)

( * ) Notice: Subject to any disclaimer, the term of this patent is extended or adjusted under 35 U.S.C. 154(b) by 112 days.

(21) Appl. No.: 15/772,059

(22) PCT Filed: Nov. 2, 2015

(86) PCT No.: PCT/CN2015/093592
§ 371 (c)(1),
(2) Date: Apr. 28, 2018

(87) PCT Pub. No.: WO2017/075745
PCT Pub. Date: May 11, 2017

(65) Prior Publication Data
US 2018/0316364 A1 Nov. 1, 2018

(51) Int. Cl.
H03M 13/15 (2006.01)
H03M 13/45 (2006.01)
(Continued)

(52) U.S. Cl.
CPC ....... *H03M 13/1525* (2013.01); *H03M 13/15* (2013.01); *H03M 13/151* (2013.01);
(Continued)

(58) Field of Classification Search
CPC .. H03M 13/15; H03M 13/116; H03M 13/151; H03M 13/1525; H03M 13/154;
(Continued)

(56) References Cited

U.S. PATENT DOCUMENTS 4,455,655 A * 6/1984 Galen ................ G11B 20/1833
714/758
2010/0031120 A1 2/2010 Belogolovy et al.
(Continued)

FOREIGN PATENT DOCUMENTS

| CN | 101753147 A | 6/2010 |
|----|-------------|--------|
| TW | 201029339 A1 | 8/2010 |
| TW | 201044796 A | 12/2010 |

OTHER PUBLICATIONS

Lin et al., Decoding the (31, 16, 7) Quadratic Residue Code in GF(2^5), Jul. 25-28, 2009, 2009 4th International Conference on Computer Science & Education, pp. 239-243 (Year: 2009).*

(Continued)

*Primary Examiner* — Cynthia Britt
*Assistant Examiner* — Sazzad Hossain
(74) *Attorney, Agent, or Firm* — Metis IP LLC

(57) ABSTRACT

A method for decoding a cyclic code is disclosed. The method includes: determining a plurality of syndromes for the cyclic code; determining, by a hardware processor, a first coefficient and a second coefficient based on the plurality of syndromes; determining, by the hardware processor, a third coefficient based on the second coefficient; and generating an error-locator polynomial based on the first coefficient, the second coefficient, and the third coefficient.

20 Claims, 15 Drawing Sheets

(51) Int. Cl.
*H03M 13/37* (2006.01)
*H03M 13/11* (2006.01)

(52) U.S. Cl.
CPC ....... *H03M 13/154* (2013.01); *H03M 13/159* (2013.01); *H03M 13/1545* (2013.01); *H03M 13/1575* (2013.01); *H03M 13/3746* (2013.01); *H03M 13/455* (2013.01); *H03M 13/116* (2013.01); *H03M 13/1515* (2013.01)

(58) Field of Classification Search
CPC ......... H03M 13/1545; H03M 13/1575; H03M 13/159; H03M 13/3746; H03M 13/455; H03M 13/1515
See application file for complete search history.

(56) References Cited

U.S. PATENT DOCUMENTS

| | | | | |
|---|---|---|---|---|
| 2010/0131807 A1* | 5/2010 | Truong | ............... | H03M 13/151 714/704 |
| 2011/0276862 A1 | 11/2011 | Truong et al. | | |
| 2013/0159819 A1 | 6/2013 | Jiang et al. | | |
| 2013/0326315 A1* | 12/2013 | Elia | ........................ | G06F 7/724 714/785 |

OTHER PUBLICATIONS

Lee, Hung-Peng et al, Improvement on Decoding of the (71,36,11) Quadratic Residue Code, The 6th International Conference on Computer Science&Education (ICCSE) Aug. 5, 2011(Aug. 5, 2011), pp. 324-329.
H.C. Chang et al. A Weight Method of Decoding the (23,12,7) Golay Code Using Reduced Table Lookup, Communications, Circuits and Systems, 2008. ICCCAS 2008. International Conference on Oct. 24, 2008, 5 pages.
International Search Report for PCT/CN2016/104395 dated Jan. 25, 2017, 4 pages.
Written Opinion of the International Searching Authority for PCT/CN2016/104395 dated Jan. 25, 2017, 4 pages.
International Search Report in PCT/CN2015/093592 dated Jul. 26, 2016, 4 pages.
Written Opinion of the International Searching Authority for PCT/CN2015/093592 dated Jul. 26, 2016, 4 pages.

\* cited by examiner

METHODS, SYSTEMS, AND COMPUTER-READABLE MEDIA FOR DECODING A CYCLIC CODE

CROSS-REFERENCE TO RELATED APPLICATIONS

The application is a U.S. national stage application under 35 U.S.C. § 371 of International Application No. PCT/CN2015/093592, filed on Nov. 2, 2015, designating the United States of America, the entire contents of which are hereby incorporated by reference.

TECHNICAL FIELD

The present disclosure relates to methods, system, and computer-readable media for decoding a cyclic code. More particularly, the present disclosure relates to decoding a cyclic code and performing error correction on the cyclic code based on syndromes of the cyclic code.

BACKGROUND

In today's digital era, a wide variety of signals—such as video and audio signals—are digitalized. A few examples of products that use digital signals include digital TV, Bluetooth headphones, DVD players, WAP mobile phone handsets, etc. To ensure that the signals used in digital products can be read properly, enabling the products to present high-definition video and audio even when the signals have been transmitted over long distances, the signals are typically encoded and decoded. However, since transmission media and channels are easily corrupted by interference during data access and transmission, error detection and correction has become more and more significant. Generally, error-correcting codes are widely used for enhancing reliability of data access and transmission. In the error-correcting codes, application of a cyclic code is not uncommon.

Fourier transforms exist in a finite field GF(q), cyclic codes, such as BCH code, Reed Solomon and Quadratic residue codes, using Fourier transform can be described in a setting closer to the signal processing. Cyclic codes are vectors in the field GF(q) and are constrained to be zero at certain components. A finite field (also known as a Galois field) is a field composed of a finite number of elements. The number of elements in the field called the order or cardinality of the field. This number is always of the form pin, where p is a prime number and in is a positive integer. A Galois field of order $q=p^m$ will in the following be designated either as GF (pin) or as Fq, these symbols being fully synonymous. A polynomial over an arbitrary field (including a finite field) will be designated as p(x), as p(x) or a similar symbol. An element in which the polynomial is to be evaluated will in the following designated by lower-case Greek letters such as $\alpha$, $\beta$ or $\gamma$. The definitions and properties of finite fields are described in many standard textbooks of mathematics, and reference is made to such standard textbooks for details.

In some cases, the error correction method of cyclic codes involves the use of an algebraic decoding method to eliminate unknown syndromes from among the Newton's identities so as to obtain the error polynomial coefficient, which in turn can be used obtain the error polynomial. However, as the length of cyclic codes increases, it becomes increasingly difficult for the high order equations produced when using an algebraic method to find a solution over a Galois field, making it difficult to obtain the error polynomial. To solve the problems discussed above, the present disclosure provides an error correction system applicable to all cyclic code.

SUMMARY

A method for decoding a cyclic code is disclosed. The method includes: determining a plurality of syndromes for the cyclic code; determining, by a hardware processor, a first coefficient and a second coefficient based on the plurality of syndromes; determining, by the hardware processor, a third coefficient based on the second coefficient; and generating an error-locator polynomial based on the first coefficient, the second coefficient, and the third coefficient.

In some embodiments, the cyclic code is a Quadratic Residue code.

In some embodiments, wherein the plurality of syndromes includes a known syndrome, and wherein the second coefficient is determined based on the known syndrome.

In some embodiments, the method further includes determining a number of roots of the error-locator polynomial; and determining a number of errors in the cyclic code based on the number of roots of the error-locator polynomial.

In some embodiments, the method further includes performing a first inversion on the cyclic code by inverting a first bit of the cyclic code to generate an inverted code; and determining whether the first inversion has corrected an error in the cyclic code.

BRIEF DESCRIPTION OF THE DRAWINGS

The accompanying drawings, which are incorporated in and constitute a part of this specification, illustrate several embodiments of the disclosure and together with the description, serve to explain the principles of the disclosure. In the drawings.

DETAILED DESCRIPTION OF THE DISCLOSURE

The preferred embodiments of the present disclosure have been disclosed in the description and examples. However the examples should not be construed as a limitation to the actual applicable scope of the disclosure, and as such, all modifications and alterations without departing from the spirits of the disclosure and appended claims shall remain within the protected scope and claims of the disclosure.

In accordance with various implementations, mechanisms (which can include methods, systems, and media) for decoding a cyclic code are provided. The mechanisms can decode and/or correct a cyclic code (e.g., a Quadratic Residue (QR) code) based on one or more known syndromes of the cyclic code. For example, the mechanisms can correct one or more errors occurred in the cyclic code based on an error-locator polynomial corresponding to the cyclic code. More particularly, for example, the mechanisms can determine the error-locator polynomial (e.g., by calculating one or more coefficients of the error-locator polynomial based on one or more known syndromes of the cyclic code). The mechanisms can then determine one or more roots of the error-locator polynomial. The errors may then be corrected based on the roots of the error-locator polynomial.

Figure 1:
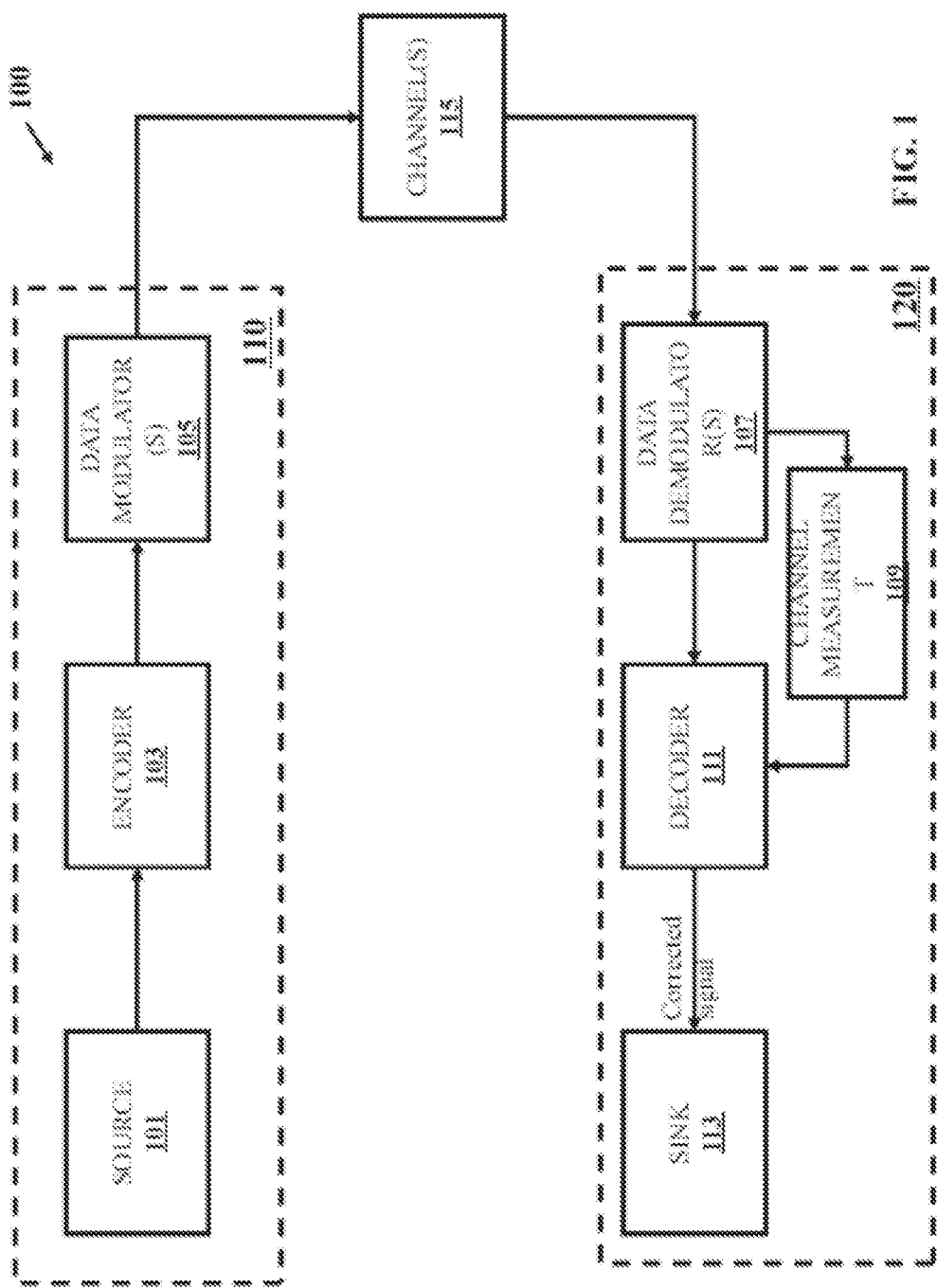
FIG. 1 illustrates a block diagram of an example of a system in accordance with some embodiments of the present disclosure.

As another example, one or more errors occurred in the cyclic code may be corrected by performing one or more bit inversions on the cyclic code. More particularly, for example, a first bit of the cyclic code may be inverted to generate an inverted code. The first bit may be selected based on reliability associated with the first bit. If the inversion of the first bit can correctly correct an error in the cyclic code, the mechanisms can decode the inverted code. Alternatively, if the inversion of the first bit introduce an additional error into the cyclic bit, the mechanisms can flip back the inverted bit and can invert a second bit of the cyclic code. In some embodiments, the first bit and the second bit can be associated with a first reliability score and a second reliability score, respectively. In some embodiments, the first reliability score is lower than the second reliability score. In some embodiments, multiple inversions may be performed on the cyclic code bit-by-bit until a predetermined threshold number of inversions have been performed on the cyclic code. FIG. 1 illustrates a block diagram of an example 100 of a system in accordance with some embodiments of the present disclosure. As shown, system 100 may include a sender 110 and a receiver 120, a transmission channel 115, and/or any other component for error correction and detection. The sender 110 may include a source device 101, an encoder 103, a data modulator 105, and/or any other component for processing and sending signal. The receiver 120 may include a data demodulator 107, a channel measurement 109, a decoder 111, a sink device 113, and/or any other component for receiving and processing signal.

Source device(s) 101 may be sequence signal generator, pulse signal generator, function generator, binary signal generator, or the like, or any combination thereof. Source device(s) 101 may generate on or more messages, for example, binary information, training sequence, pseudorandom sequence, or the like, or any combination thereof.

In some embodiments, source device(s) 101 may generate a message (also referred to herein as the "original message") and may transmit the original message to encoder 103 for further processing. Upon receiving the original message, encoder 103 may encode the original message to generate an encoded message. For example, the original message may be encoded based upon a generator polynomial G(x) to generate a source code. In some embodiments, the source code may be a cyclic code (e.g., a Quadratic Residue code). The cyclic code may be associated with parameters n, k, and d that represent the length of the cyclic code, the message length of the original message signal, and the Hamming distance of the cyclic code respectively. In some embodiments, an original message polynomial (e.g., a polynomial corresponding to the original message) may be determined using the following equation:

$$M(x)=\Sigma_{i=0}^{k-1}m_i x_i=m_0+m_1 x_1+\ldots+m_{k-1}x_{k-1} \quad (1)$$

In equation (1), in may be the smallest positive integer such than n divides $2^m-1$. $\alpha$ may be an element of $GF(2^m)$ (e.g., $\alpha \in GF(2^m)$) and may be a root of a primitive polynomial. Thus, multiplicative groups of nonzero elements in the finite field $GF(2^m)$ may be generated based on $\alpha$. Hence, $\beta=\alpha^u$ may be a primitive $n^{th}$ root of unity in the finite field, where $u=(2^m-1)/n$. In some embodiments, the generator polynomial G(x) may be determined based on the following equation:

$$G(z)=\Pi_{i \in Q}(z-\beta^i) \quad (2)$$

In equation (2), Q denotes a set of indices for known syndromes of the cyclic code.

In some embodiments, the cyclic code may include one or more components and may be defined as $c=(c_0, c_1, \ldots, c_{n-1})$. A component of the cyclic code (e.g., $c_0, c_1$, etc.) may be determined based on the following equation:

$$c_j=M(\beta) \text{ for } 0 \leq j \leq n-1 \quad (3)$$

In equation (3), i denotes an index of the j-th component. In some embodiments, the cyclic code c can be represented as a polynomial as equation (4).

$$c(x)=\Sigma_{j=0}^{n-1}c_j x^j=c_0+c_1 x+\ldots+c_{n-1}x^{n-1} \quad (4)$$

Data modulator(s) 105 may receive the cyclic code encoded by the encoder 103 (e.g., the source code) and may then determine a transmitted waveform based on the source code. The data modulator(s) 105 may modulate the encoded message to generate a modulated signal for transmission. In some embodiments, the modulated signal may be generated based on one or more amplitude modulation schemes, frequency modulation schemes, phase modulation schemes, and/or any other suitable modulation scheme. Examples of the modulation schemes include amplitude-shift keying (ASK), frequency-shift keying (FSK), phase-shift keying (PSK) (e.g., quadrature phase-shift keying (QPSK), offset-QPSK, etc.), etc.

The modulated signal may be transmitted through channel(s) 115 and may be received by data demodulator(s)

107. In some embodiments, the channel(s) 115 may be wireless channel, for example, channel with memory, channel without memory, constant channel, variable-parameters channel, single-user channel, multiple-user channel, noisy channel, noiseless channel, fading channel, or the like, or any combination thereof. In some embodiments, the channel(s) 115 may also be Rayleigh fading channel, Rice channel, or Gaussian channel. In some embodiments, the channel(s) 115 may be wired channel, for example, open wire, Symmetrical cable, coaxial cable, Optical fiber, or the like, or any combination thereof.

Upon receiving the transmitted signal, data demodulator(s) 107 may demodulate the transmitted signal to generate a demodulated signal. For example, the demodulation may be the reverse process (to the modulation performed by the data modulator(s) 105) to recover the source code. The demodulated signal may include a code (also referred to herein as the "received code") corresponding to the source code. For example, errors may be introduced into the transmitted code by interference during transmission through the channel 115. The interference during transmission channel 115 may include Doppler shift, noise, channel fading, echo interference, serial interference, intersymbol interference, inter-channel interference, the like, or any combination thereof. In some embodiments, an error pattern attributed to the interference can be represented as an error polynomial:

$$e(x)=\Sigma_{j=0}^{n-1}e_j x^j=e_0+e_1 x+\ldots+e_{n-1}x^{n-1} \quad (5)$$

In equation (5), $e_j$ is the jth error correction value.

In some embodiments, the received code may correspond to a combination of the error pattern and the source code. For example, the received code can be determined based on the following equation:

$$r(x)=\Sigma_{j=0}^{n-1}r_j x^j=c(x)+e(x)=r_0+r_1 x+\ldots+r_{n-1}x^{n-1} \quad (6)$$

Data demodulator(s) 107 can transmit the received code to channel unit 109 and/or decoder (s) 111 to obtain a decoded message. Channel measurement unit 109 may generate information about reliability of the received code. For example, channel measurement unit 109 may determine a reliability score indicative of the reliability of a bit of the received code. More particularly, for example, channel measurement unit 109 may determine n positive numbers (e.g., denoted as $\delta=(\delta_0, \delta_1, \ldots \delta_{n-1})$) for n bits of the received code. In some embodiments, the reliability score may be determined based on the magnitude of the corresponding channel observation, a probability that the bit of the received code contains an error, etc. In some embodiments, a bit associated with a higher reliability score (e.g. a greater value of $\delta_i$) may be regarded as being more reliable than a bit associated with a lower reliability score (e.g., a smaller value of $\delta_i$). Alternatively, a bit associated with a lower reliability score (e.g. a less value of $\delta_i$) may be regarded as being more reliable than a bit associated with a higher reliability score (e.g., a greater value of $\delta_i$).

The decoder 111 may decode the received code and may outputs the corrected message to the sink 113. In some embodiments, the sink 113 may be and/or include a signal processor for analyzing the received information. In some embodiments, decoder 111 may be and/or include a decoder as described below in connection with FIG. 2.

The communication system may comprise, for example, a cellular system, a satellite system, a point-to-point communication link, or any other suitable communication system that employs cyclic code or other error correction code. Although the example of FIG. 1 refers to a wireless communication system, the techniques described herein can be used within wire line communication systems, such as cable communication system, as well. Furthermore, the communication system may comprise other modules which a communication system should comprise, such as one or more antennas, RF-front, Analog-to-Digital Converters (ADC), frequency converters, memory, or the like, or any combination thereof. There, RF-front, frequency converter and ADC may be configured or used to convert the received signal form the receiver 120 to the received code which can be processed in digital domain.

Figure 2:
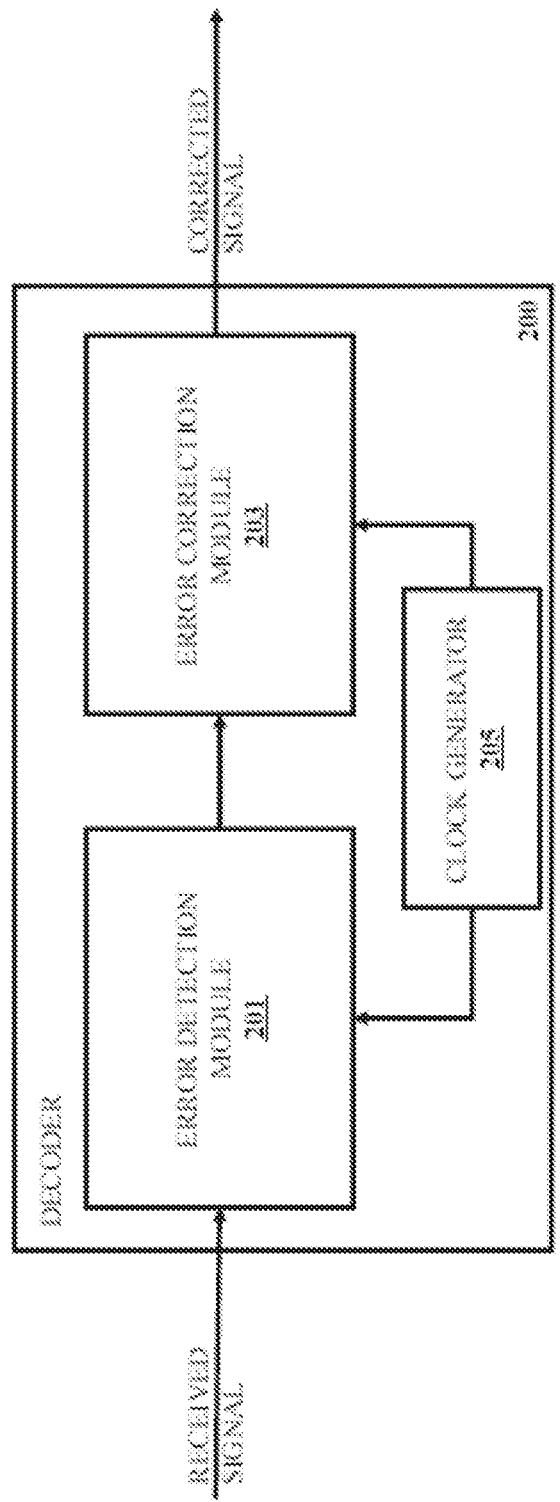
FIG. 2 illustrates a clock diagram illustrating an example of a decoder in accordance with some embodiments of the disclosed subject matter.

Referring to FIG. 2, a block diagram 200 illustrating an example of a decoder 111 shown in FIG. 1 in accordance with some embodiments of the disclosed subject matter is shown.

As illustrated, the block diagram 200 may include an error detection module 201, an error correction module 203, a clock generator 205, and/or any other component for decoding, error detection, error correction, and/or performing any other suitable function. As described above in connection with FIG. 1, the block diagram 200 may correct the errors of the received code to output a corrected code corresponding to the cyclic code of the source message.

Upon receiving a code (e.g., a code transmitted through channel 115 of FIG. 1), error detection module 201 may detect one or more error patterns corresponding to the received code. The error correction module 203 may be configured to produce a corrected code by correcting the received code based on the detected error patterns. In some embodiments, error detection module 201 may be and/or include an error detection module as describe below in conjunction with FIG. 3.

Clock generator 205 may b generate and/or provide clock signals for error detection module 201, error correction module 203, and/or any other component of the block diagram 200. For example, clock generator 201 can generate system clocks and/or any other type of clock signals that may be used to perform error detection and/or correction for cyclic codes in accordance with embodiments of the present disclosure. Clock generator 205 may include any suitable circuit that can produce clock signals. For example, clock generator 205 may be and/or include one or more oscillators, phase-locked loops (PLL), and/or any other clock generators.

The decoder 111 and the modules of the decoder 111 may be implemented in software, in hardware or using a combination of hardware and software elements. In some embodiments, the decoder and the modules may be implemented using general-purpose processors, which are programmed in software to carry out the functions described herein. The software may be downloaded to the processors in electronic form, over a wired or wireless network. It may, alternatively or additionally, be provided and/or stored on tangible media, such as magnetic, optical, or electronic memory.

Figure 3:
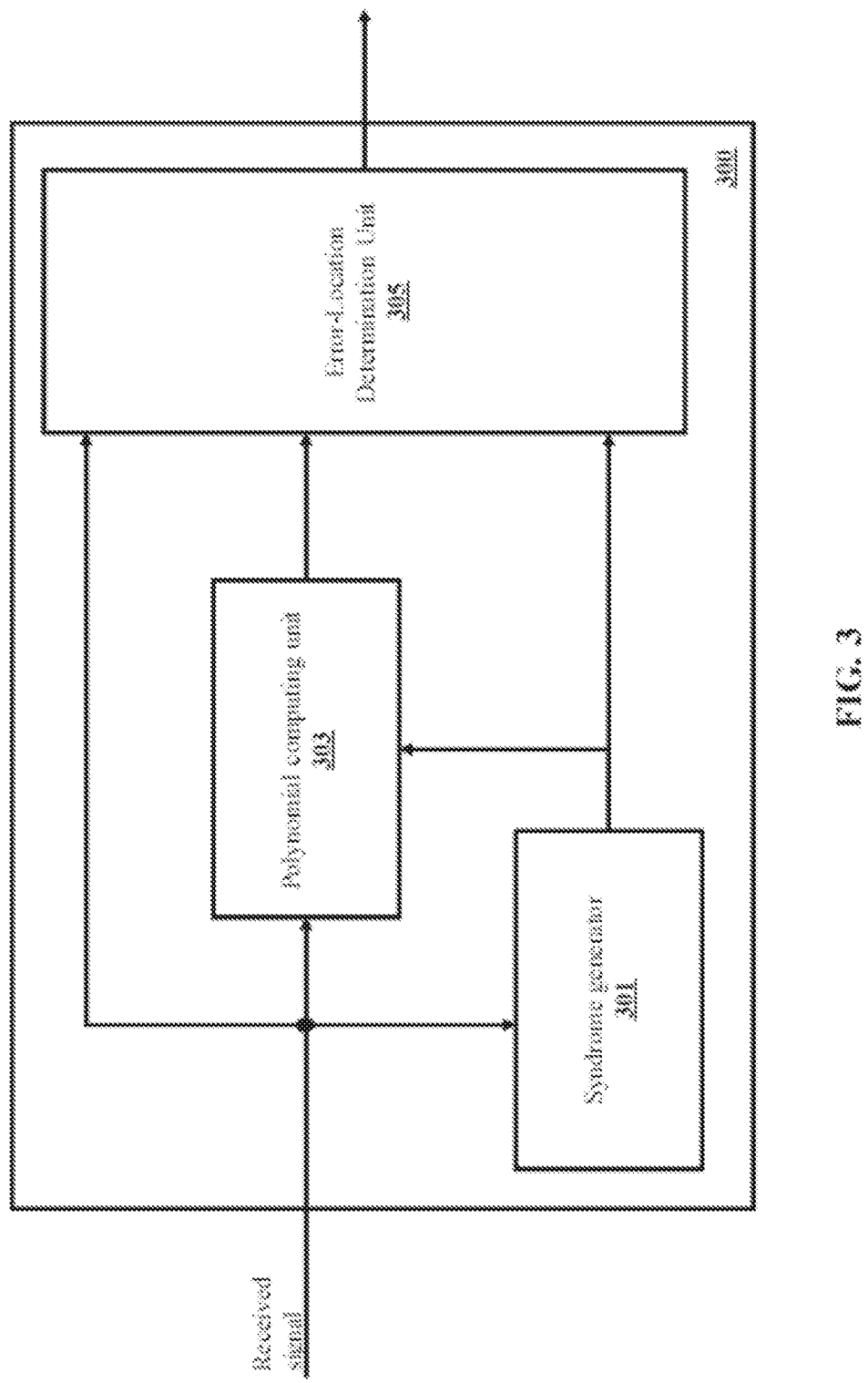
FIG. 3 is a schematic diagram illustrating an example of an error detection module in accordance with some embodiments of the disclosed subject matter.

FIG. 3 is a schematic diagram illustrating an example 300 an error detection module in accordance with some embodiments of the disclosed subject matter. As illustrated, the error detection module 300 may include a syndrome generator 301, a polynomial computing unit 303, an error-locator determination unit 305, and/or any other suitable component for performing error detection and/or correction. In some embodiments, error detection module 300 may be the same as the error detection module 201 of FIG. 2.

Syndrome generator 301 may receive a code and generate one or more syndromes for the received code. For example, one or more syndromes $S_i$ can be generated, where each of the syndromes is associated with a respective index i representing the i-th syndrome. The syndromes may include one or more known syndromes and one or more unknown syndromes. For example, a syndrome $S_i$ may be referred to as a known syndrome when i is an element of Q (e.g., a set of indices for known syndromes of the cyclic code). As another example, a syndrome $S_i$ may be referred to as an unknown syndrome when i is not an element of Q.

The syndromes may be generated based on the roots β of the generator polynomial and the received code polynomial r(x). The syndrome generator 301 may define known syndromes directly computed by evaluating r(x) at the roots of g(x) as follows:

$$S_i = r(\beta^i) = (\beta^i), \text{ for } n-1 \geq i \geq 0. \quad (7)$$

The polynomial computing unit 301 may receive the code r, the syndromes generated by the syndrome generator 301, and/or other parameter for determining an error locator polynomial. The polynomial computing unit 301 may generate the error-locator polynomial based upon the received code, the received syndromes, and/or any other information related to the received code. For example, the error-locator polynomial may be determined based on one or more coefficients. More particularly, for example, the error-locator polynomial may be expressed in terms of the coefficients based on the following equation:

$$L(z) = \Pi_{i=1}^{v}(z - Z_i) = z^v + \Sigma_{j=1}^{v} \sigma_j z^{v-j} \quad (8)$$

In equation (8), $\sigma_j$ is the j-th coefficient of the error-locator polynomial. $\sigma_j$ may be determined based on the following equation, in some embodiments:

$$\sigma_j = \Sigma_{0 \leq j_1 < j_2 < \ldots < j_i \leq v} Z_{j_1} Z_{j_2} \ldots Z_{j_i}, 1 \leq j \leq v.$$

As will be discussed in more detail below, the cyclic code, may be decoded by determining the error-locator polynomial L(z). A syndrome of the cyclic code (e.g., $S_i$) and a coefficient of the error locator polynomial (e.g., $\sigma_j$) may be derived based on the following Newton identities:

$$S_i + \Sigma_{j=1}^{i-1} \sigma_j S_{i-j} + \sigma_i = 0, (1 \leq i \leq v, i = \text{odd}) \quad (9)$$

$$S_i + \Sigma_{j=1}^{i-1} \sigma_j S_{i-j} = 0, (1 \leq i \leq v, i = \text{even}) \quad (10)$$

$$S_i + \Sigma_{j=1}^{v} \sigma_j S_{i-j} = 0, (i \geq v) \quad (11)$$

In one embodiment, the syndromes in equations (9), (10), and (11) may be known syndromes and may correspond to a given number of errors. The polynomial computing unit 301 can determine the coefficients of the error-locator polynomial based on the known syndromes (e.g., by solving $\sigma_j$, $1 \leq j \leq v$ from the Newton's identities above).

In another embodiment, one or more of the syndromes in equations (9), (10) and (11) may be unknown. The polynomial computing unit 310 can compute the unknown syndromes based upon one or more known syndromes and can then to determine the error-locator polynomial based on the Newton identities. Alternatively or additionally, the polynomial computing unit 310 can determine the coefficients of the error-locator polynomial by eliminating unknown syndromes in the Newton identities. Upon determining the error-locator polynomial, an error pattern of the cyclic code can be determined by determining the roots of L(z), for example, by applying the Chien search.

The error-locator determination unit 305 may be operatively coupled to syndrome generator 301 and/or polynomial computing unit 303. Error-locator determination unit 305 may determine locations where errors occur based on the error-locator polynomial and the received code. The generated syndromes may include one or more known syndromes and/or unknown syndromes. The error-locator determination unit 305 may also generate an error correction signal based on the syndromes, the error-locator polynomial L(z), and/or any other information related to the cyclic code. The error-locator determination unit 305 may then transmit the error correction signal to the error correction module 205 to correct the errors of the received code. In some embodiments, error-locator determination unit 305 may be and/or include an error correction unit illustrated below in connection with FIG. 7.

Figure 4:
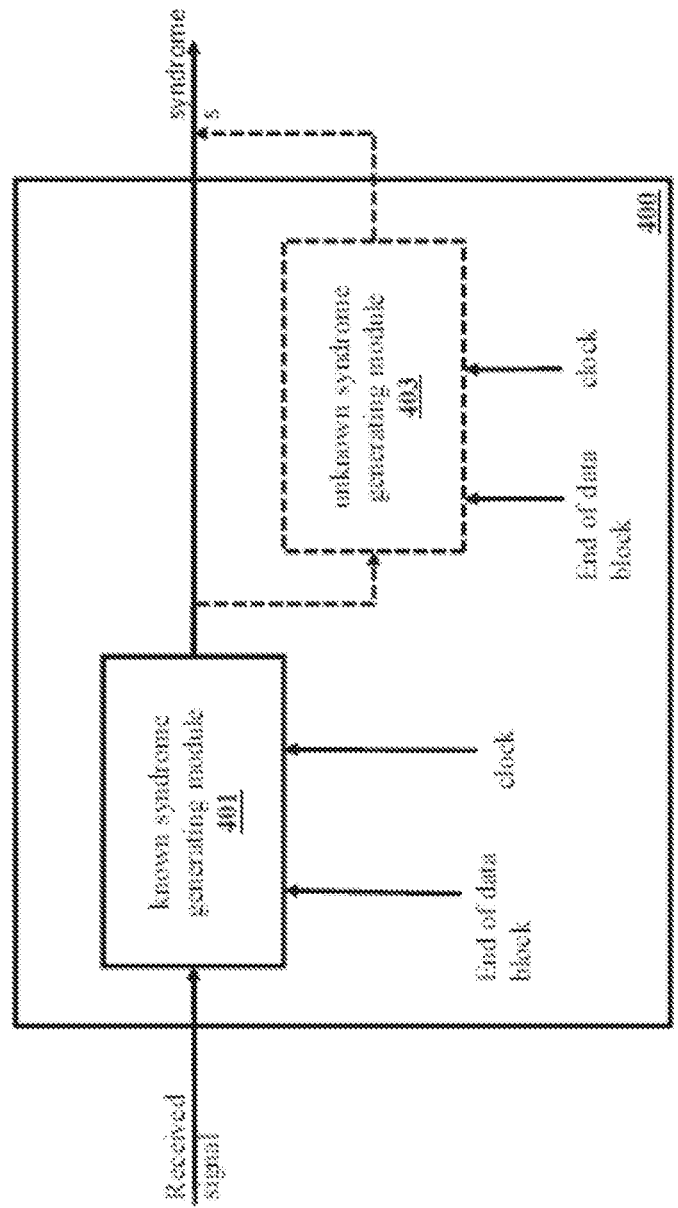
FIG. 4 illustrates an example of a syndrome generator in accordance with some embodiments of the disclosed subject matter.

Referring to FIG. 4, an example 400 of the syndrome generator 301 in FIG. 3 in accordance with some embodiments of the disclosed subject matter is shown. As illustrated, the diagram 400 of syndrome generator 301 may include a known syndrome generating module 401, an unknown syndrome generating module 403, and/or any other component for generating syndromes for cyclic codes.

Known syndrome generating module 401 may generate one or more known syndromes based upon the roots β of the generator polynomial G(x) and/or a code (e.g., the code r(x) represented by equation (6)). Then, the syndrome generator 400 may output the known syndromes to polynomial computing unit 303, error-locator determination unit 305 of FIG. 3, and/or any other device.

In some embodiments, an unknown syndrome generation module 403 may be operatively coupled to known syndrome generation module 401. Unknown syndrome module 403 may generate one or more unknown syndromes. For example, an unknown syndrome may be generated based on one or more known syndromes (e.g., using equations (9), (10), and/or (11)). Syndrome generator 400 may output one or more known syndromes and/or unknown syndromes to polynomial computing 303, error-locator determination unit 305 of FIG. 3, and/or any other device.

Furthermore, the known syndrome generating module 401 and the unknown syndrome generating module 403 may receive one or more clock signals and may determine unknown and/or known syndromes for a cyclic code based on the clock signals. In some embodiments, the clock signals can be generated by the clock generator 205 of FIG. 2.

Figure 5:
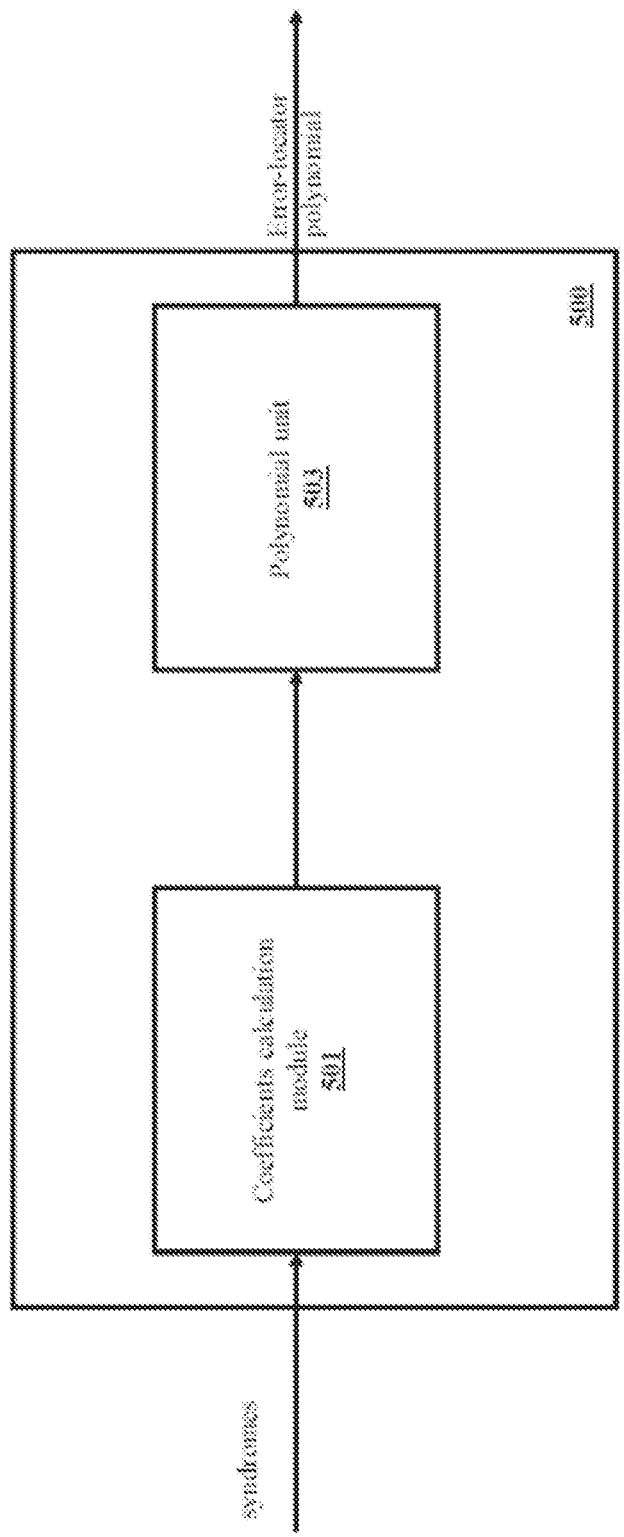
FIG. 5 is a schematic diagram illustrating an example of a polynomial computing unit in accordance with some embodiments of the disclosed subject matter.

FIG. 5 is a schematic diagram illustrating an example of the polynomial computing unit 303 shown in FIG. 3. As illustrated, polynomial computing unit 303 may include a coefficients calculation module 501, a polynomial unit 503, and/or any other component for decoding a cyclic code.

The coefficients calculation module 501 can calculate one or more coefficients of an error-locator polynomial for the cyclic code based on one or more syndromes generated by the syndrome generator 301. In some embodiments, the coefficients may be used to determine one or more error patterns for the cyclic code. For example, the coefficients of the error-locator polynomial can be calculated based on one or more known syndromes (e.g., based upon the Newton identities illustrated in equation (10), (11), and (12)).

As another example, coefficients calculation module 501 may determine one or more coefficients of the error-locator polynomial based on one or more unknown syndromes. In some embodiments, the coefficients calculation module 501 can calculate the unknown syndromes based on the Newton identities expressed in equations 9-11 and the known syndromes.

The coefficients calculation module 501 can then transmit the determined coefficients to the polynomial unit 503 for further processing. Polynomial unit 503 may determine the error-locator polynomial based on the received coefficients. Furthermore, the polynomial computing unit 303 can also generate the error-locator polynomial based upon the Berlekamp-Massey (BM) algorithm.

Figure 6:
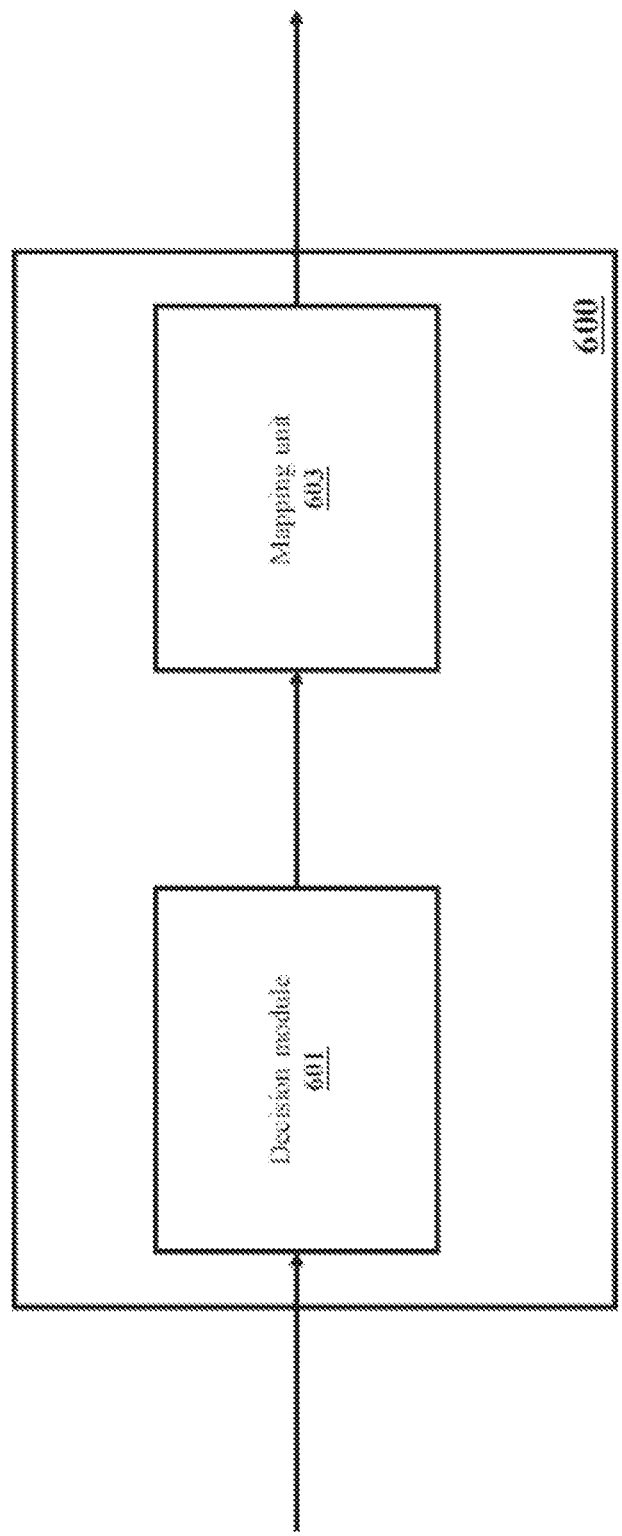
FIG. 6 is a block diagram illustrating an example of an error-locator determination unit in accordance with some embodiments of the disclosed subject matter.

FIG. 6 is a block diagram illustrating an example 600 of the error-locator determination unit 305 of FIG. 3 in accordance with some embodiments of the disclosed subject matter. As illustrated, error-locator determination unit 305 may include a decision module 601, a mapping unit 603, and/or any other component for performing error detection and/or correction.

The decision module 601 may determine a number of errors that occur in a cyclic code received by error-locator determination unit 305. For example, decision module 601 may determine the number of errors based on specified polynomials, for example, a function composed of some known syndromes and/or unknown syndromes or the error locator-polynomial received from the polynomial computing unit 303.

For a received (n, k, d) cyclic code, the decision module 601 may determine that the received (n, k, d) cyclic code is correctable in response to determining that the number of errors is not greater than an error-correcting capacity. For example, the error correcting capacity can be determined based on the following equation: $t = \lfloor (d-1)/2 \rfloor$, where $\lfloor x \rfloor$ denotes the greatest integer that is not greater than x. For example, for a (71, 36, 11) cyclic code, an error pattern may be determined as being correctable if its weight is no more than 5.

Decision module 601 may also determine the roots of the error locator polynomial accordingly. The number of errors in the received code based on the number of roots of the error-locator polynomial. In some embodiments, decision module 601 can also provide the roots of the error-locator polynomial to the mapping unit 603.

The mapping unit 603 can determine one or more error locations which indicate the location of the error bits occurred the received code based on the roots of the error-locator polynomial. The mapping unit 603 may also provide one or more error correction values that may be used to correct the errors detected in the received code. For example, mapping unit 603 may determine an error correction value $e_j$ to the error correction module 203. Assuming that the roots of the error-locator polynomial is $\alpha^m$, and that the location of the errors in the cyclic code is k. Because the roots of the error-locator polynomial corresponds to the error location, there holds the identity $\alpha^m = \beta^k <= (\alpha^u)^k$. Finally, the error location can be expressed as k=m/u. The error correction value $e_1$ is then sent to the error correction module 203 to correct the errors in the cyclic code.

Figure 7:
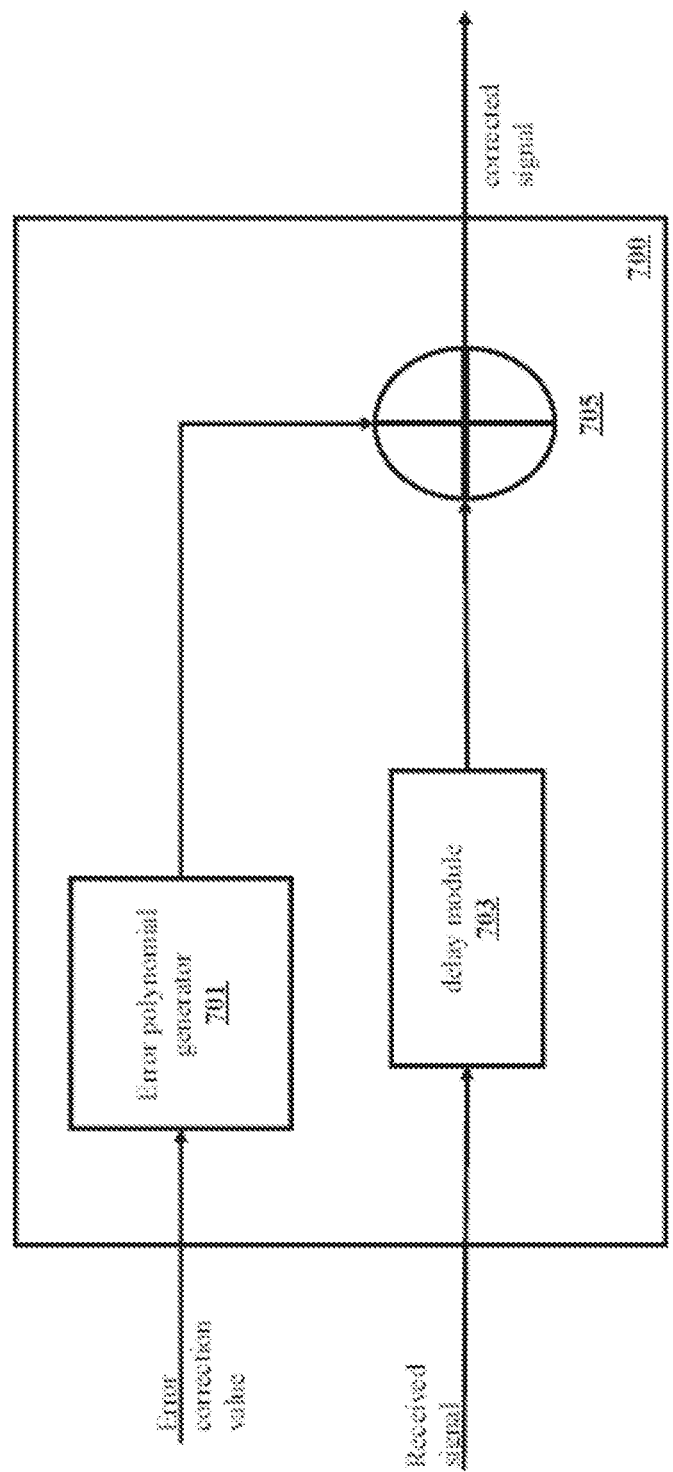
FIG. 7 is a schematic diagram 700 illustrating an example of an error correction module in accordance with one embodiment of the disclosure.

FIG. 7 is a schematic diagram illustrating an example 700 of the error correction module 203 of FIG. 2 in accordance with some embodiments of the disclosure. As shown, error correction module 700 may include an error polynomial generator 701, a delay module 703, a combiner 705, and/or any other component for performing error detection and/or correction.

As described above in connection with FIG. 2, error correction module 203 can receive one or more error correction values (e.g., one or more error correction values $e_j$ determined by error detection module 201 as shown in FIG. 2) and unit positions j which may be the coefficients of the error polynomial corresponding to the error correction values. Error correction module 203 can correct the errors in the received signal to output the corrected signal (e.g., based on the error correction values $e_j$ and the unit positions j of the received signal). For example, error polynomial generator 701 may determine that the received signal is to be corrected in response to determining that one or more of the received error correction values are not equal to zero. In some embodiments, error polynomial generator 701 can generate an error polynomial for the received signal based on one or more of the error correction values, unit positions, and/or any other information about the received code. For example, the error polynomial can be determined based on the following equation:

$$e(x) = \Sigma_{j=0}^{n-1} e_j x^j. \tag{12}$$

The delay module 703 can receive the code and can delay the code for a certain period of time. For example, the code may be delayed based on a clock signal (e.g., a system clock provided by clock generator 205 and/or any other clock generator).

The combiner 705 can receive the error polynomial generated by the error polynomial generator 701 and the delayed code produced by delay module 703. The combiner 705 may then generate a corrected signal by combining the delayed code and the error polynomial. For example, the combiner 705 can be and/or include an adder that can generate a corrected signal c(x) based on the following equation:

$$c(x) = r(x) + e(x). \tag{13}$$

In some embodiments, the combiner 705 may output the corrected signal to other component of error correction module and/or decoder 111 for further processing, for example, read information of the received signal.

FIGS. 3-7 give a detailed description of one embodiment of the present disclosure. Other embodiments of the disclosure will be apparent to those skilled in the art from consideration of the specification of practice of the disclosure disclosed herein. For example, the modules of the error correction system can be implemented in any suitable order or simultaneously in appropriate circumstances. In addition, individual module can be removed from the system without departing from the spirit and scope of the subject matter described herein. Various aspects of any module described above can be combined with various aspects of an example in other modules described, for example, the error-locator determine unit 305 can be a part of the error correction module 203, and the calculation of the error-value can be implemented in the error correction module 203 and so on. It does not influence the scope of the present disclosure defined in the following claims. It is intended that the specification and examples be considered as exemplary only, with a true scope and spirit of the disclosure being indicated by the following claims.

Figure 8:
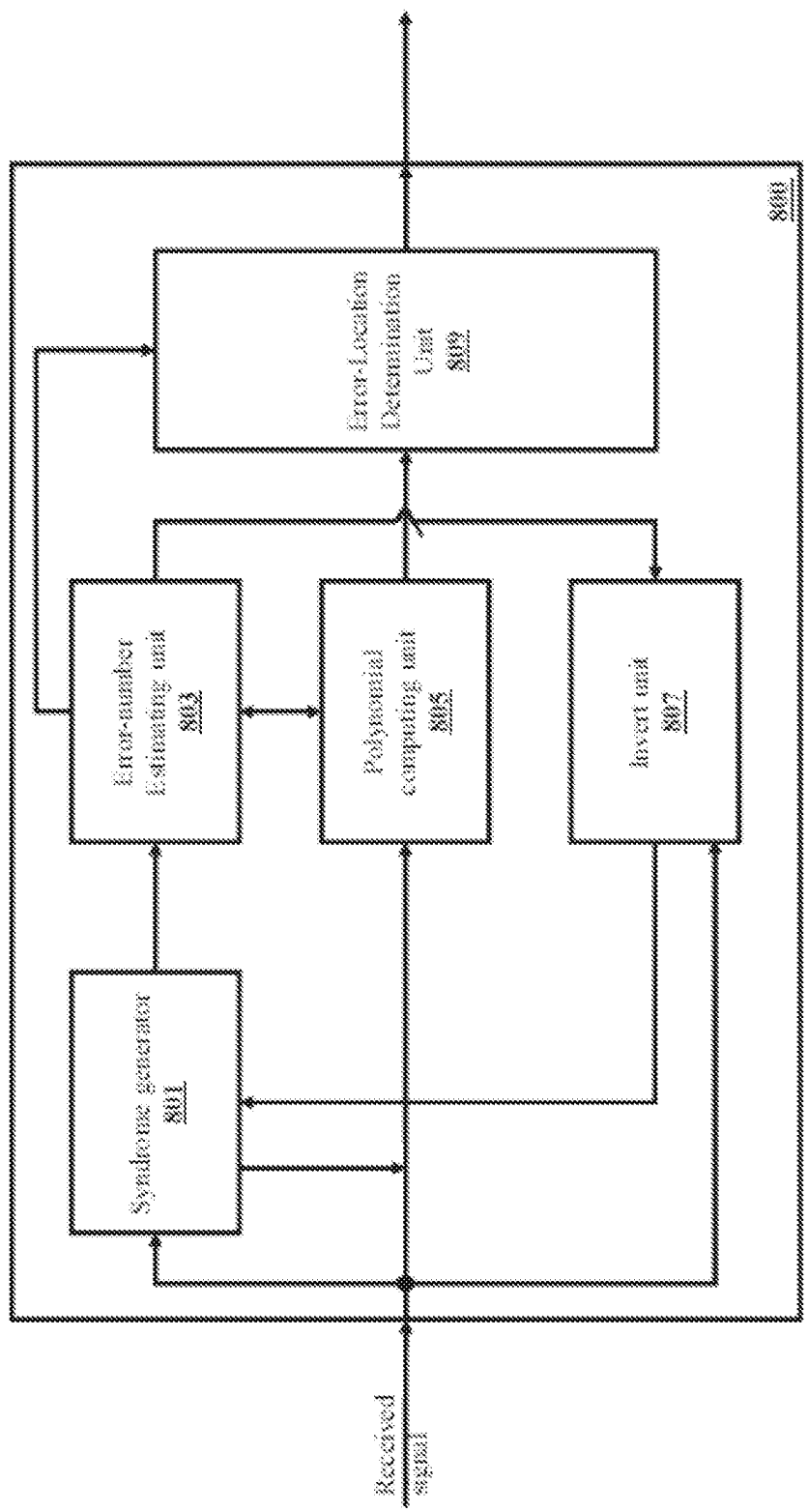
FIG. 8 is a schematic diagram illustrating an example of an error detection module in accordance with another embodiment of the disclosed subject matter.

FIG. 8 is a schematic diagram illustrating an example 800 of the error detection module 201 of FIG. 2 in accordance with another embodiment of the disclosed subject matter. As illustrated, the error detection module 201 may include a syndrome generator 801, An error-number estimating unit 803, a polynomial computing unit 805, an invert unit 807, an error-locator determination unit 809, and/or any other suitable component for performing error detection and/or correction.

The syndrome generator 801 may receive a cyclic code and may generate one or more syndromes (e.g., one or more known syndromes, unknown syndromes, etc.) for the received code. In some embodiments, the syndrome generator 801 may be or include the syndrome generator 400 as described in connection with FIG. 4.

The error-number estimating unit 803 may receive the syndromes generated by the syndrome generator 801 and may determine the number of errors that occurred in the received code. For example, the number of errors can be determined based on one or more known syndromes of the received code (e.g., based on a specific polynomial composed of known syndrome). More particularly, for example, the error-number estimation unit 803 may determine that the received code has one error by determining whether $S_1$ is zero or not. In some embodiments, the error-number estimating unit 803 may determine the number of errors based on the number of different roots of the error-locator polynomial generated by polynomial computing unit 805. For example, in response to determining that the error-locator polynomial have four different roots, the error-number estimating unit 803 may determine that four errors occurred in the received code. In some embodiments, the error-number estimating unit 803 may determine the number of errors through both the specific polynomial composed of syndromes and the error-locator polynomial. For example, if the received code may have fewer errors, for example, one, two, and/or three, the error-number estimating unit 803 may determine number of errors through the specific polynomial. When the received code may have more errors, for example, four, five, and/or more, the error-number estimating unit 803 may determine the number of errors through the error-locator polynomial.

The polynomial computing unit 805 may calculate the coefficients of the error-locator polynomial and may generate the error-locator polynomial corresponding to the received code by performing one or more operations as described above in conjunction with the polynomial computing unit in FIG. 5. The polynomial computing unit 805 may transmit the error-locator polynomial to the error-locator determination unit 809.

The invert unit 807 may invert one or more error bit of the received code based on the number of errors generated in the error-number estimating unit 803, information received from channel measurement 109, and/or any other information. The invert unit 807 may determine whether one or more bits of the received code are to be inverted. In some embodiments, this determination can be made based on the number of errors determined by error-number estimating unit 803. For example, the invert unit 807 can compare the number of errors with a threshold number of errors (e.g., four, five, etc.). More particularly, for example, the invert unit 807 may determine that the bits of the received code are to be inverted in response to determining that the number of errors is greater than the threshold. Alternatively, the invert unit 807 may determine that the bits of the received code are not to be inverted in response to determining that the number of errors is not greater than the threshold.

The invert unit 807 may invert one or more bits of the received code based on the information from the channel measurement 109. For example, the invert unit 807 may generated an inverted code by inverting a bit of the received code that is associated with particular reliability (e.g., the lowest reliability). The invert unit 807 may then transmit the inverted code to the syndrome generator 801 to generate one or more syndromes for the inverted code. The generated syndromes may be transmitted to the error-number estimating unit 803 for estimating the number of errors of the inverted code. Upon determining that the bit inversion performed on the received code has corrected one or more errors of the received code (e.g., the inverted code having fewer errors than the received code) and/or that the number of the errors is smaller than the threshold, the error-number estimating unit 803 transmits the information to the polynomial computing unit 805 which may generate an error-locator polynomial for the inverted code. Alternatively, upon determining that the bit inversion performed on the received code has not corrected an error of the received code, the number estimating unit 803 may transmit the received code to the invert unit 807. The invert unit 807 may then flip back the inverted bit and may invert a next bit of the received code based on the information from channel measurement 109. This procedure described above can be iteratively implemented until a threshold number of bit inversions have been performed on the received code. For example, if the number of the errors in the inverted code is still larger than the threshold of errors after the invert unit 807 has recursively performed γ bit inversions on the received code, then the error correction decoder can declare a decoding failure.

The error-locator determination unit 809 may obtain the corresponding error locations based on the error-locator polynomial generated by the polynomial computing unit 805. The error-locator determination unit 809 may be similar to the error-locator determination unit 600 described in the FIG. 6.

Figure 9:
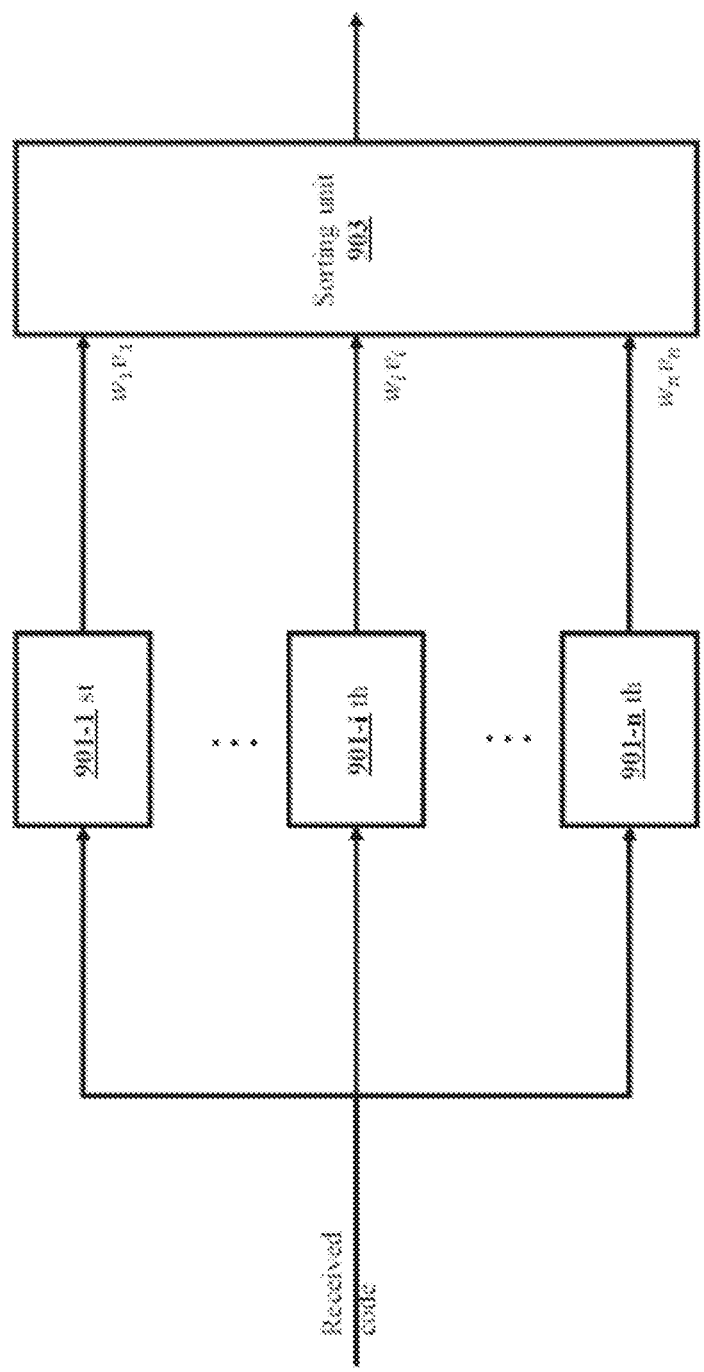
FIG. 9 is a schematic diagram illustrating an example of a channel measurement unit in accordance with some embodiments of the disclosed subject matter.

FIG. 9 shows a schematic diagram illustrating an example 900 of a channel measurement unit in accordance with some embodiments of the disclosed subject matter. In some embodiments, channel measurement unit 900 may be the channel measurement unit 109 of FIG. 1.

As illustrated, the channel measurement unit 900 may include one or more decision filters 901-1, 901-2, . . . , 901-N, a sorting unit 903, and any other suitable component for performing channel measurement.

Each of the decision filters 901-1, 901-2, . . . , and 901-N may generate a reliability score indicative of the reliability of a bit of the received code and/or a probability that the bit may correspond to an error. For example, each of the decision filters 901-1, 901-2, . . . , and 901-N can generate a weighted decision vector based on a code received by channel measurement unit 900. For example, each of the decision filters 901-1, 901-2, . . . , and 901-N may generate a decision vector that can be used to generate the weighted decision vector. More particularly, for example, a decision vector v may be generated by the i-th decision filter based on the following equations:

$$\text{if } v_i \geq 0, \text{ say } \hat{c}_i = r_i = 0 \qquad (14)$$

$$\text{if } v_i < 0, \text{ say } \hat{c}_i = r_i = 1 \qquad (15)$$

In equations (14) and (15), the $\hat{c}_i$ and $r_i$ may represent a transmitted code and the received code, respectively.

Each of the decision filters 901-1, 901-2, . . . , and 901-N may multiply the decision vector by a weight factor $w_i$. The decision filters 901-1, 901-2, . . . , and/or 901-N may then determine measurement reliability score for each bit of the received code based on the magnitude of the output of the decision filters 901-1, 901-2, . . . , and/or 901-N, represented as $\delta_i = |w_i v_i|$. The reliability score may represent a bit error-probability, a channel observation, a bit reliability, or the like, or any combination thereof.

The sorting unit 903 may sort the channel measurement in ascending or descending order. For example, if the channel measurement represents the bit error-probability, the sorting unit 903 may sort the bit the channel measurement in ascending order for further processing.

Figure 10:
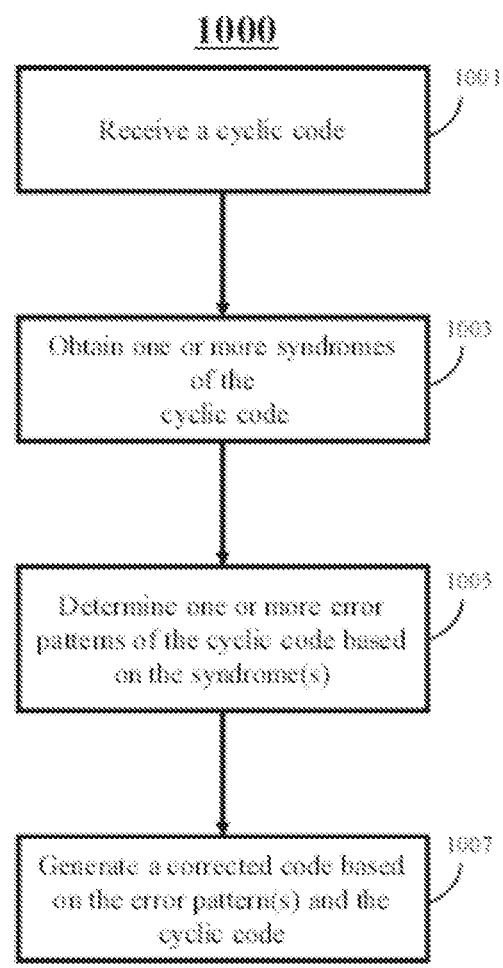
FIG. 10 is a flow chart illustrating an example of a process for decoding a cyclic code according to some embodiments of the disclosed subject matter.

FIG. 10 is a flow chart illustrating an example 1000 of a process for decoding a cyclic code according to some embodiments of the disclosed subject matter. In some embodiments, process 1000 can be executed using one or more hardware processors implementing a decoder as described above in connection with FIGS. 1-9.

As shown, process 1000 can begin by the decoder receiving a cyclic code at block 1001. The cyclic code may be transmitted through a channel (e.g., a wireless channel, a wired channel, a Rayleigh fading channel, a Rice fading channel, a Gaussian channel, etc.).

At 1003, the decoder can generate one or more syndromes for the cyclic code. For example, the decoder may calculate one or more known syndromes for the received cyclic code (e.g., based on equation (7)). As another example, the decoder may calculate one or more unknown syndromes (e.g., based on the Newton identities given in equations 9-11).

At 1005, the decoder can determine one or more error patterns of the cyclic code based on the syndromes. For example, the decoder may construct an error-locator polynomial based on the syndromes. The decoder may then determine an error pattern corresponding to the cyclic code based on the error-locator polynomial (e.g., by determining roots of the error-locator polynomial). More particularly, for example, an error pattern of the cyclic code may be determined based on equations (8)-(12). In some embodiments, the error pattern(s) may be determined by performing one or more operations described below in connection with FIGS. 11 and 12.

At 1007, the decoder can generate a corrected code based on the error pattern(s) and the cyclic code. For example, the decoder can detect one or more errors in the cyclic code that are to be corrected. The decoder can also determine one or more error locations and/or error correction values corresponding to the detected errors. The decoder can then generate the corrected code by combining the error correction values and the cyclic code. More particularly, for example, the corrected code can be generated using the error-locator determination unit 313 and/or the error correction module 312 as described above in connection with FIGS. 2, 6, and 7.

Figure 11:
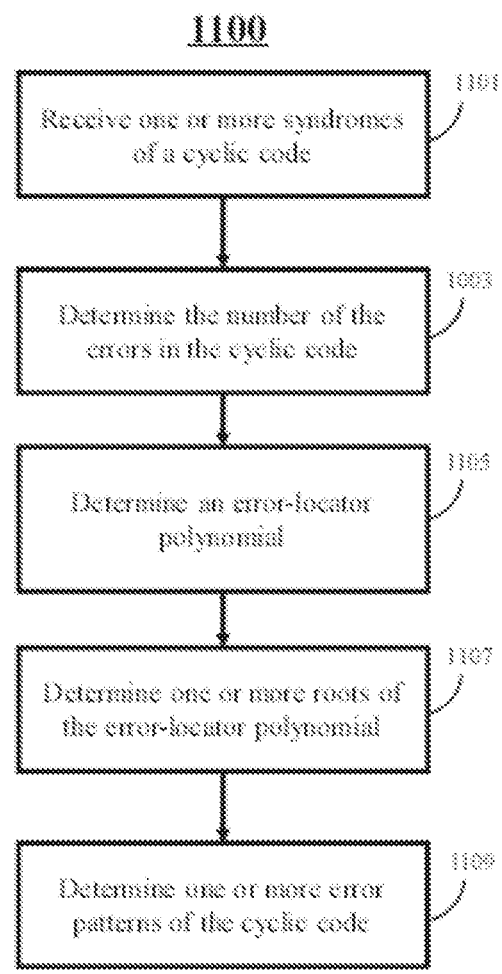
FIG. 11 is a flow chart illustrating an example of a process for obtaining an error patter for a cyclic code according to one embodiment of the disclosed subject matter.

FIG. 11 shows a flow chart illustrating an example 1100 of a process for determining an error patter of a cyclic code according to an embodiment of the disclosed subject matter. In some embodiments, process 1100 can be executed by one or more hardware processors implementing a decoder as described above in connection with FIGS. 1-9.

As illustrated, process 1100 can begin by the decoder obtaining one or more syndromes of a cyclic code at 1101. The syndromes may include one or more known syndromes, unknown syndromes, etc. In some embodiments, the syndromes may be obtained by performing one or more operations described above in connection with block 1003 of FIG. 10.

At 1103, the decoder can determine a number of errors occurred in the cyclic code. For example, the decoder can construct one or more expressions based on the syndromes and can then determine the number the errors based on the expressions. In some embodiments, the number of errors in the cyclic code can be determined based on some functions composed of some known syndromes and/or unknown syndromes, for example, in (71, 36, 11) cyclic code, a known syndrome S1 may be used to determine whether the cyclic code have at least one error. Additionally, the number of errors in the cyclic code may also be determined by the error locator-polynomial received from the polynomial computing unit 303.

At 1105, the decoder can determine an error-locator polynomial based on the number of errors. For example, the decoder can determine one or more coefficients of the error-locator polynomial based on the number of the errors. For example, the equations (9)-(11) may be used to calculate the coefficients of the error-locator polynomial when the number of errors is less than the error-correcting capacity.

At 1107, the decoder can determine one or more roots of the error-locator polynomial. For example, when the coefficients of the error-locator polynomial have been determined, the decoder may determine the roots of the error-locator polynomial through Chien search.

At 1109, the decoder can determine an error pattern for the cyclic code based on the roots of the error-locator polynomial. For example, the decoder can search one or more error locations in the cyclic code based on the roots of the error-locator polynomial. For example, there may be an identity $\alpha^m=\beta^k=(\alpha^u)^k$ if the roots of the error-locator polynomial correspond to the error location and then the error location can be expressed as k=m/u.

Figure 12:
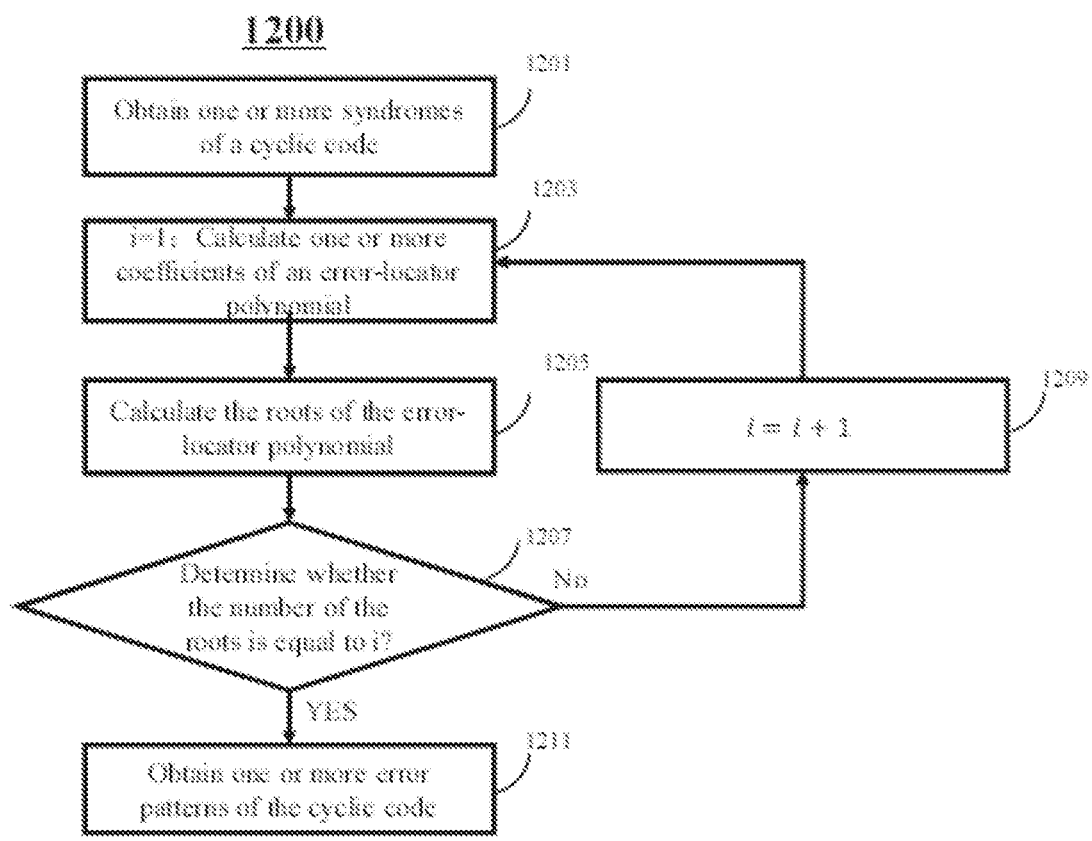
FIG. 12 is a flow chart illustrating an example of a process for obtaining an error pattern of a cyclic code according to another embodiment of the disclosed subject matter.

FIG. 12 shows a flow chart illustrating an example 1200 of a process for obtaining an error pattern corresponding to a cyclic code according to another embodiment of the disclosed subject matter. In some embodiments, process 1200 can be executed by one or more hardware processors implementing a decoder as described above in connection with FIGS. 1-9.

As illustrated, process 1200 can begin by the decoder obtaining one or more syndromes of a cyclic code at 1201. The syndromes may include one or more known syndromes, unknown syndromes, etc. In some embodiments, the syndromes may be obtained by performing one or more operations described above in connection with block 1003 of FIG. 10.

At 1203, the decoder may assign a first value to a number of errors in the cyclic code and may calculate one or more coefficients of an error-locator polynomial corresponding to the cyclic code. For example, the decoder may assume that the number of errors in the cyclic code is one. The decoder may also calculate the coefficients based on the assigned value of the number of errors in the cyclic code. In a more particular example, when the number of errors in the cyclic code is 1, the error-locator polynomial may be determined based on equation (9). The decoder may calculate a first coefficient of the error-locator polynomial (e.g., $\sigma_1$ in equation (9)) based on the equation (10) as a known syndrome $S_1$.

At 1205, the decoder may calculate the roots of error-locator polynomial based on the coefficients of the error-locator polynomial. For example, the error-locator polynomial may be determined as $L(Z)=Z\ S_1$ based on the coefficients when one error occurred in the cyclic code. Then the decoder may determine the root of error-locator polynomial as $Z=S_1$. As another example, in some embodiments in which two errors occurred in the cyclic code, there may be two roots, which may be determined based on $L(Z)=Z^2+S_1Z+\sigma_2$.

At 1207, the decoder may determine whether the number of roots is equal to the first value. In some embodiments, the decoder may proceed to 1211 in response to determining that the number of roots of the error-locator polynomial is not the same as the first value. For example, when i=1 and the root of the error-locator polynomial may be determined as $Z=S_1$, the decoder may proceed to 1211 to obtain one or more error patterns of the cyclic code. For example, the decoder may map the roots of the error-locator polynomial to the error-pattern.

Alternatively, in response to determining that the number of the roots is not equal to the first value, the decoder may proceed to 1209. At 1209, the decoder may assigning a next value to the number of errors in cyclic code. For example, the next value may be determined by incrementing the first value by a certain step (e.g., one, two, three, or any other suitable integer). The decoder may then loop back to 1203. For example, the decoder may calculate one or more coefficients of the error-locator polynomial corresponding to the cyclic code based on the next value. More particularly, for example, a second coefficient ("$\sigma_2$") of the error-locator polynomial can be determined based on $L(Z)=Z^2+S_1Z+\sigma_2$. The decoder can calculate the roots of the error-locator polynomial and can determine whether the number of the roots of the error-locator polynomial is equal to the next value. In some embodiments, in response to determining that the number of the roots of the error-locator polynomial is not equal to the next value, the decoder may determine that the number of errors in the cyclic code is greater than the next value and may proceed to 1299.

Furthermore, there also exits a third example for obtaining the error patterns of the cyclic code which combines the first example and the second example. In the third example, it will define an integer j which is smaller than the correction capacity. When assumed number of errors is smaller than the j, it is preferred to use the first method to estimate the number of the errors through the expression expressed by the known syndromes. In the other case, it will be preferred to use the second example method to estimate the number of the errors by the relationship between the number of the roots of the error-locator polynomial and the assumed number of errors.

Still furthermore, there will be another integer q used to decrease the complexity of the correction processing. When the assumed number of errors is larger than the integer q, there will be a invert unit to invert some bits of the cyclic code with better or worse reliability or error-possibility, and then to the initial processing to obtain the syndromes of the inverted cyclic code for the next processing.

Figure 13:
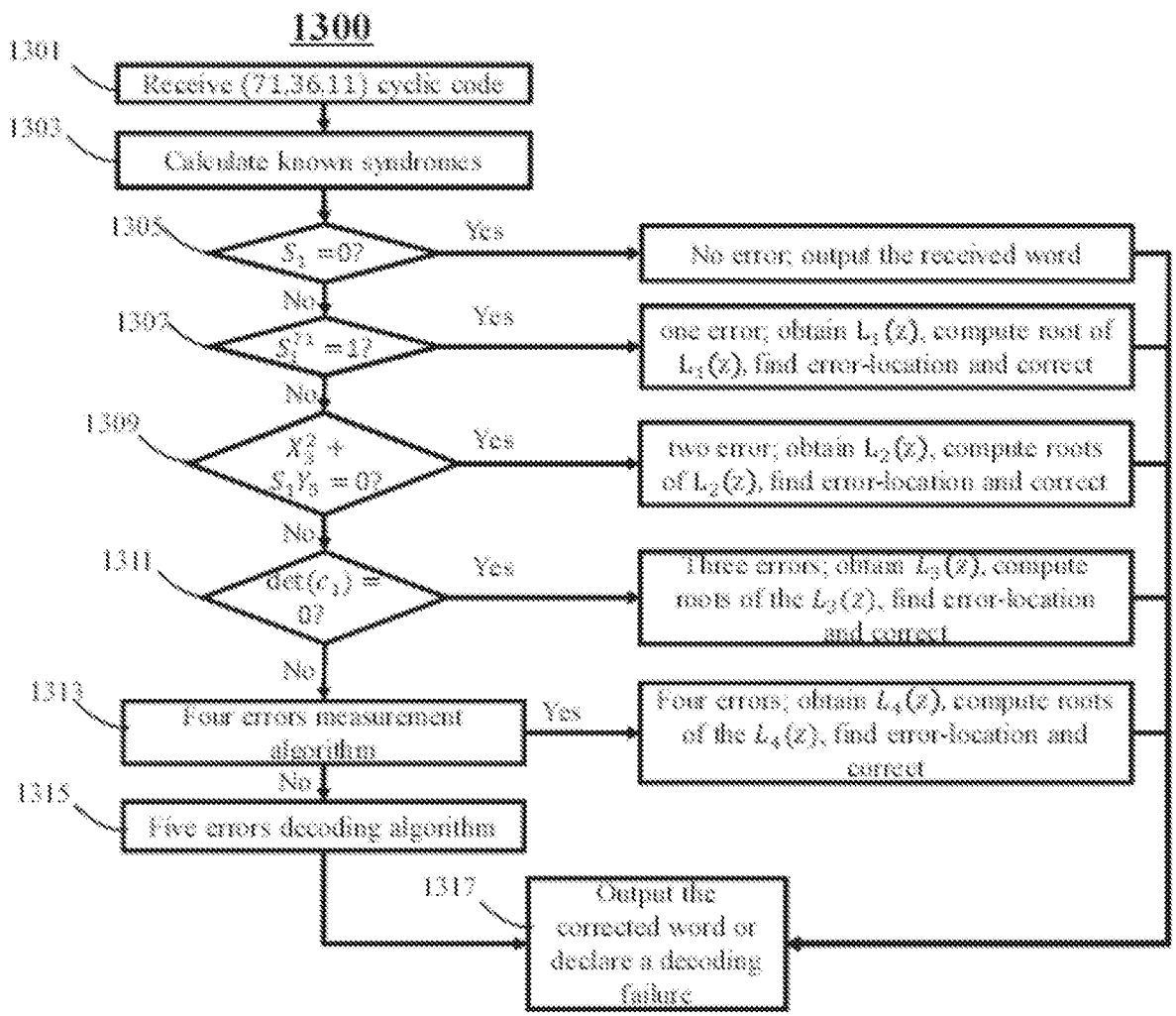
FIG. 13 is a flow chart illustrating method process for decoding a Quadratic Residue (QR) code according to some embodiments of the disclosed subject matter.

FIG. 13 is a flow chart illustrating method process for decoding a Quadratic Residue (QR) code according one an embodiment of the disclosed subject matter. In some embodiments, process 1300 may be executed using one or more hardware processors implementing a decoder as describe above in connection with FIGS. 1-9.

As illustrated, process 1300 may begin by the decoder obtaining a QR code at 1301. The QR code can be a special cyclic code when the prime is a quadratic residue modulo the prime. The QR code can be a (71, 36, 11) QR code. The QR code may be transmitted through a channel (e.g., a wireless channel, a wired channel, a Rayleigh fading channel, a Rice fading channel, a Gaussian channel, etc.).

At 1303, the decoder may calculate one or more known syndromes of the QR code. For a (71, 36, 11) QR code, the number of errors should be less than or equal to the error-correcting capacity $t=\lfloor(11-1)/2\rfloor=5$. The set $Q_{71}$ composed of index of known syndromes may be written as:

$$Q_{71}=\{1,2,3,4,5,6,8,9,10,12,15,16,18,19,20,24,25,27,\\29,30,32,36,37,38,40,43,45,48,49,50,54,57,58,\\60,64\} \quad (16)$$

At 1305, the decoder may determine whether at least one error occurs in the QR code. For example, the decoder can determine whether a first known syndrome (e.g., $S_1$) is equal to zero. In response to determining that the first known syndrome is equal to zero, the decoder may determine that the received QR code does not have error bits, and may then proceed to 1317. Alternatively, in response to determining that the first known syndrome is not zero, the decoder may determine that the QR code may contain one or more errors and may then proceed to 1307.

At 1307, the decoder may determine whether the function composed of known syndrome $S_1^{71}$ is equal to 1 or not. When $S_1^{71}=1$ (YES side), it means that the received (71, 36, 11) QR code has one error bits, and then the decoder may be configured or used to obtain error-locator polynomial, compute root of the error-locator polynomial, find error-locator and correct the error bit as describe above in connection with FIGS. 10-12. And then the process 1300 may advance to 1317. When $S_1^{71}\neq 1$ (NO side), it means that there may be two or more errors occurred in the received (71, 36, 11) QR code, and then the process 1300 may advance to 1307.

At 1309, the decoder may be configured or used to judge whether the function composed of known syndrome $X_3^2+S_1Y_5$, wherein $X_3=S_3+S_1^3$, $Y_5=S_1^2S_3+S_5$, is equal to zero or not. When $X_3^2+S_1Y_5=0$ (YES side), it means that the received (71, 36, 11) QR code has two errors bits, and then the decoder may be configured or used to obtain error-locator polynomial, compute root of the error-locator polynomial, find error-locator and correct the error bit as describe above in connection with FIGS. 10-12. In some embodiments, the error-locator polynomial may be determined as $L_2(z)=Z^2+S_1Z+X_3/S_1$ based on the equation (8) as $v=2$, and then $\sigma_1$ and $\sigma_2$ can be calculated based on the Newton identities equations (9)-(11) as $\sigma_1=S_1$ and $\sigma_2=X_3/S_1$. The process 1300 may advance to 1317. When $X_3^2+S_1Y_5\neq 1$ (NO side), it means that there may be three or more errors occurred in the received (71, 36, 11) QR code, and then the process 1300 may advance to 1311.

At 1311, the decoder may determine whether the cyclic code has three errors (e.g., three error bits). For example, the decoder may determine whether the error-locator polynomial corresponding to the cyclic code has three roots. As another example, the decoder may determine a function composed of known syndromes $\det(c_1)$, wherein $$c_1 = \begin{bmatrix} S_0 & S_1 & S_4 & S_5 \\ S_1 & S_2 & S_5 & S_6 \\ S_5 & S_6 & S_9 & S_{10} \\ S_{15} & S_{16} & S_{19} & S_{20} \end{bmatrix},$$

is equal to zero or not. When $\det(c_1)=0$ (YES side), it means that the received (71, 36, 11) QR code has three errors bits, and then the decoder may be configured or used to obtain error-locator polynomial, compute root of the error-locator polynomial, find error-locator and correct the error bit as describe above in connection with FIGS. 10-12. In some embodiments, the error-locator polynomial may be determined as $L_3(z)=Z^3+S_1Z^2+\sigma_2Z+\sigma_3$ based on the equation (8) as $v=3$, and then $\sigma_1$, $\sigma_2$, and $\sigma_3$ can be calculated based on the Newton identities equations (9)-(11) as $\sigma_1=S_1$, $\sigma_2=Y_5/X_3$, and $\sigma_3=(X_3^2+S_1Y_5)/X_3$. The process 1300 may advance to 1317. When $\det(c_1)\neq 0$ (NO side), it means that there may be four or more errors occurred in the received (71, 36, 11) QR code, and then the process 1300 may advance to 1313.

At 1313, the decoder may determine whether the cyclic code has four errors (e.g., four error bits). For example, the decoder may determine whether the error-locator polynomial corresponding to the cyclic code has four roots (e.g., four different roots). As another example, the decoder may make this determination by determining whether $c_{f1}$ is equal to zero or not, wherein $c_{f1}$ may be shown in the following equations:

$$c_{f1} = \begin{bmatrix} S_0 & S_1 & S_2 & S_{24} & S_{37} \\ S_1 & S_2 & S_3 & S_{25} & S_{38} \\ S_6 & 0 & S_8 & S_{30} & S_{43} \\ S_8 & S_9 & S_{10} & S_{32} & S_{45} \\ S_{36} & S_{37} & S_{38} & S_{60} & S_2 \end{bmatrix} + \begin{bmatrix} S_0 & S_2 & S_4 & S_{24} & S_{37} \\ S_1 & S_3 & S_5 & S_{25} & S_{38} \\ S_3 & S_5 & 0 & S_{27} & S_{43} \\ S_8 & S_{10} & S_{12} & S_{32} & S_{45} \\ S_{36} & S_{38} & S_{40} & S_{60} & S_2 \end{bmatrix}.$$

In some embodiments, block 1313 may be performed by performing one or more operations described in connection with FIG. 14. If the received code has four errors, the decoder may be configured or used to obtain error-locator polynomial, compute root of the error-locator polynomial, find error-locator and correct the error bit as describe above in connection with FIGS. 10-12, and then the process 1300 may advance to 1317. If the received code does not have four errors, it means that there may be five or more errors in the received code, and then the process 1300 may advance to 1315.

Figure 15:
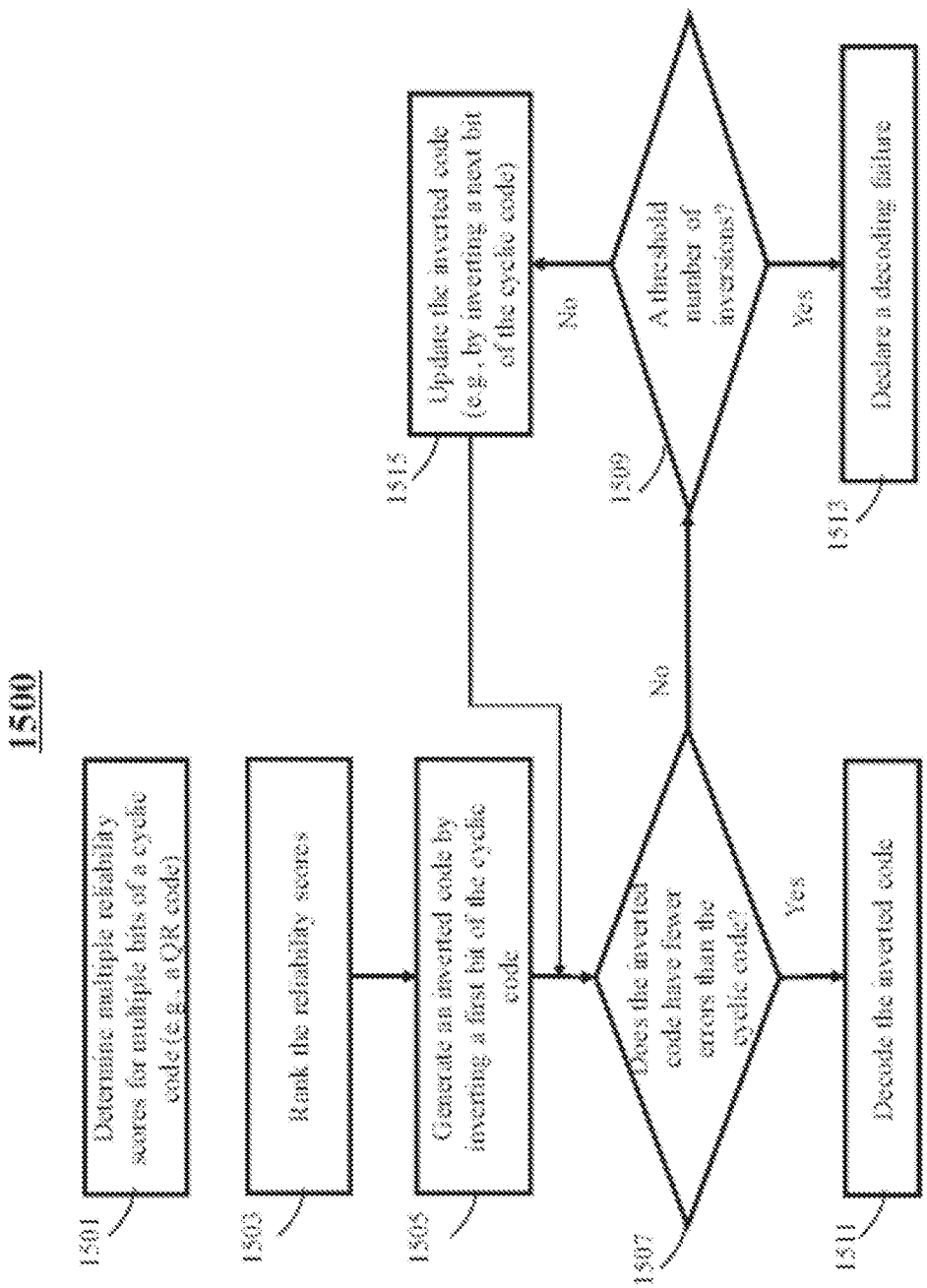
FIG. 15 is a flow chart illustrating an example of a process for decoding a cyclic code in accordance with some embodiments of the disclosed subject matter.

At 1315, the decoder may implement five errors decoding algorithm shown in FIG. 15 for the further processing. If the received code have five errors, it will be corrected. If the errors occurred in the received code is more than five, it mean that the errors occurred in the received code is beyond the capacity of the decoding algorithm, the decoder may be configured or used to declare a decoding failure.

At 1317, the decoder may be configured or used to output the corrected code in the described operation in 1301-1315 and/or declare a decoding failure.

Figure 14:
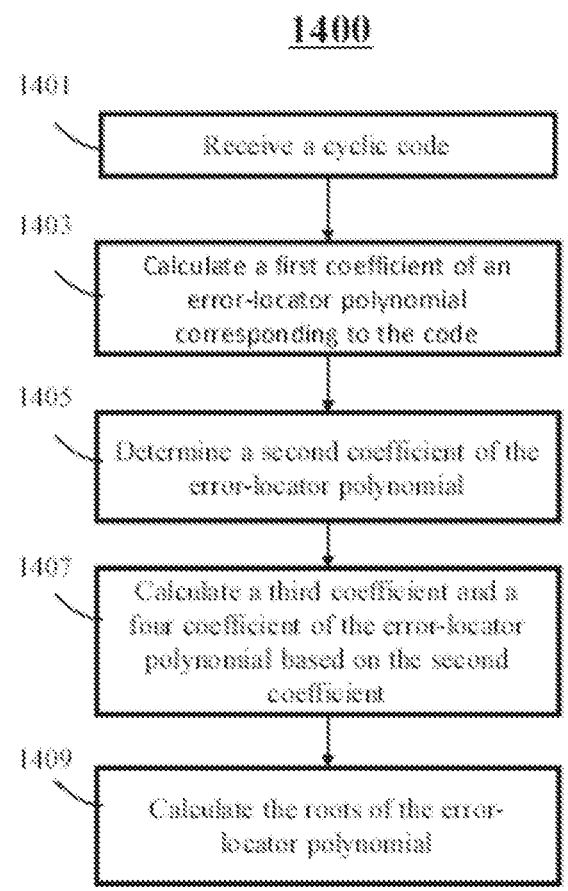
FIG. 14 is a flow chart illustrating an example of a process for implementing an error measurement algorithm in accordance with some embodiments of the disclosed subject matter.

FIG. 14 is a flow chart illustrating a process for implementing an error measurement algorithm in accordance with some embodiments of the disclosed subject matter. The error measurement algorithm may be the error measurement algorithm shown in FIG. 13. In some embodiments, process 1400 can be executed by one or more hardware processors implementing a decoder as described above in connection with FIG. 13.

As illustrated, process 1400 may begin by the decoder determining that a cyclic code at 1401. The cyclic code may contain four or more errors in some embodiments.

At 1403, the decoder can calculate a first coefficient of an error-locator polynomial corresponding to the code. For example, the first coefficient (e.g., $\sigma_1$) may be determined based on a known syndrome of the code (e.g., $S_1$).

In some embodiment, the error polynomial corresponding to a (71, 36, 11) QR code may be expressed as $L_4(z)=Z^4+\sigma_1 Z^3+\sigma_2 Z^2+\sigma_3 Z+\sigma_4$, where $\sigma_1$, $\sigma_2$, $\sigma_3$, and $\sigma_4$ may represent a first coefficient, a second coefficient, a third coefficient, and a fourth coefficient of the error polynomial, respectively. The coefficients of the error-locator polynomial may be calculated based on one or more syndromes of the QR code. For example, the coefficients may be determined based on the following equations: a $$\sigma_1 = S_1,$$

$$\sigma_2 = (S_1 X_7 + S_3 X_5)/(S_1 X_5 + S_3 X_3),$$

$$\sigma_3 = X_3 + S_1 \sigma_2, \text{ and}$$

$$\sigma_4 = Y_5 + X_5 \sigma_2)/S_1,$$

where $X_3 = S_3 + S_1^3$ and $Y_5 = S_1^2 S_3 + S_5$.

As such, the first coefficient of the error polynomial (e.g., $\sigma_1$) relates to the known syndrome $S_1$. The second coefficient (e.g., $\sigma_2$), the third coefficient (e.g., $\sigma_3$), and the fourth coefficient (e.g., $\sigma_4$) of the error polynomial may be related to an unknown syndrome $S_7$. The first coefficient of the error polynomial (e.g., $\sigma_2$) may not have to be related to an unknown syndrome. The third coefficient (e.g., $\sigma_3$) and the fourth coefficient (e.g., $\sigma_4$) can be represented in terms of the second coefficient.

At 1405, the decoder can calculate a second coefficient of the error polynomial. For example, the decoder can calculate the second coefficient of the error polynomial $\sigma_2$ without using the unknown syndrome $S_7$ based on the Newton identities expressed as follows:

$$S_1 + \sigma_1 = 0 \tag{17}$$

$$S_3 + S_2 \sigma_1 + S_1 \sigma_2 + \sigma_3 = 0 \tag{18}$$

$$S_5 + S_4 \sigma_1 + S_3 \sigma_2 + S_2 \sigma_3 + S_1 \sigma_4 = 0 \tag{19}$$

$$S_7 + S_6 \sigma_1 + S_5 \sigma_2 + S_4 \sigma_3 + S_3 \sigma_4 = 0 \tag{20}$$

$$S_9 + S_8 \sigma_1 + S_7 \sigma_2 + S_6 \sigma_3 + S_5 \sigma_4 + S_4 \sigma_5 = 0 \tag{21}$$

$$S_{19} + S_{18} \sigma_1 + S_{17} \sigma_2 + S_{16} \sigma_3 + S_{15} \sigma_4 + S_{14} \sigma_5 = 0 \tag{22}$$

$$S_{20} + S_{19} \sigma_1 + S_{18} \sigma_2 + S_{17} \sigma_3 + S_{16} \sigma_4 + S_{15} \sigma_5 = 0 \tag{23}$$

Based on equations (17)-(21), the decoder may obtain:

$$a_2 \sigma_2^2 + a_1 \sigma_2 + a_0 = 0, \tag{24}$$

where $$a_2 = S_1 X_5 + S_3 X_3$$

$$a_1 = S_1^3 X_5 + S_1^2 S_3 X_3$$

$$a_0 = S_1 X_9 + S_5 Y_5 + S_1 S_3^2 X_3$$

Based on equations (22)-(24), the decoder may obtain:

$$b_2 \sigma_2^2 + b_1 \sigma_2 + b_0 = 0,$$

where, $$b_2 = S_1 S_{15} X_3 + S_1 Y_{18} = (S_{15} X_3 + Y_{18})$$

$$b_1 = S_{15}^3 a_2 + S_1 S_5^4 + S_1^{16} S_5 + S_1^3 Y_{18}$$

$$b_0 = S_{15} X_3 Y_5 + S_1^2 X_3 (Y_{18} + S_1^{18}) + S_1 S_{19} X_3$$

Wherein $X_3 = S_3 + S_1^3$, $X_5 = S_5 + S_1^5$, $X_9 = S_9 + S_1^9$, $Y_5 = S_1^2 S_3 + S_5$, $Y_{18} = S_9^2 + S_3 S_1^{15}$.

In some embodiments, the second coefficient of the error polynomial may not have to be determined based on the unknown syndrome $S_7$. For example, the second coefficient $\sigma_2$ can be determined based on the following equation:

$$\sigma_2 = (a_0 b_2 + a_2 b_0)/(a_1 b_2 + a_2 b_1) \tag{25}$$

At 1407, the decoder may determine one or more the third coefficient and the fourth coefficient of the error polynomial. For example, the third coefficient $\sigma_3$ and the fourth coefficient $\sigma_4$ can be determined based on the second coefficient of the error polynomial. More particularly, for example, the third coefficient and the fourth coefficient of the error polynomial can be determined based on one or more of equations (17)-(23).

At 1409, the decoder can determine the error-locator polynomial based on the first coefficient, the second coefficient, the third coefficient, and/or the fourth coefficient. More particular, for example, the error-locator polynomial can be determined as:

$$L_4(z) = Z^4 + \sigma_1 Z^3 + \sigma_2 Z^2 + \sigma_3 Z + \sigma_4.$$

At 1411, the decoder may calculate one or more roots of the error-locator polynomial. For example, the roots of the error-locator polynomial can be determined by performing one or more operations as describe in connection with FIGS. 10-12 above.

FIG. 15 shows a flow chart illustrating an example 1500 of a process for decoding a cyclic code according to some embodiments of the disclosed subject matter. In some embodiments, process 1500 may be executed by one or more hardware processors implementing the decoder as described in connection with FIGS. 10-12.

As illustrated, process 1500 may begin by determining multiple reliability scores for multiple bits of a cyclic code (e.g., a QR code) at 1501. In some embodiments, the reliability scores may be generated by the channel measurement unit 900 as described in connection with FIG. 9.

At 1503, the decoder can rank the reliability scores. For example, the reliability scores may be ranked in ascending order, descending order, or any other suitable order to sort reliability associated with the bits of the cyclic code. The ranking may be performed by the channel measurement unit 900 described in connection with FIG. 9.

At 1505, the decoder may generate an inverted code by inverting a first bit of the cyclic code that is associated with a first reliability score. In some embodiments, the first reliability score may be the lowest reliability score, the second lowest reliability score, the highest reliability score, the second highest reliability score, etc. In some embodiments, the first reliability score may indicate that the first bit of the cyclic code is associated with the lowest reliability, the $m^{th}$ lowest reliability, any other reliability among the bits of the cyclic code.

At 1507, the decoder may determine the number of errors in the inverted code and may determine whether the inverted code has fewer errors than the cyclic code. Alternatively or additionally, the decoder may determine whether at least one error in the cyclic code has been corrected by inverting the first bit. For example, the decoder may determine an error-locator polynomial for the inverted code and may determine the number of roots of the error-locator polynomial. The decoder may then determine the number of errors in the inverted code based on the number of roots of the error-locator polynomial. More particularly, for example, the number of errors in the inverted code may be determined as being the same as the number of roots of the error-locator polynomial.

The decoder can also calculate one or more known syndromes for the inverted code. In some embodiments, the cyclic code may be represented as $r_m(x)=r(x)+x^{I[m]}$, where $r(x)$ is the received code. $x^{I[m]}$ is the error pattern corresponding to the cyclic code, the bits of which may have the $m^{th}$ lowest reliability.

In some embodiments, the received code may contain five errors (e.g., an error-locator polynomial corresponding to the received code having five different roots). In such embodiments, in response to determining that the inverted bit is one of the five errors and/or that the inverted code has four errors (e.g., "YES" at 1507), the decoder may proceed to 1509 and may decode the inverted code. For example, the decoder can decode the inverted code by performing one or more operations as described in connection with FIG. 13-14 and t may output a corrected code. In this case, the received code have five errors and I[m] is the corresponding fifth error location.

In some embodiments, in response to determining that the inverted code has more errors than the cyclic code and/or that the inverted bit is not one of the errors in the inverted code, the decoder may proceed to 1509.

At 1509, the decoder may determine whether a threshold number of inversions have been performed on the received code. For example, the decoder may determine whether the number of inversion that have been performed on the received code is greater than the threshold number of inversions. In some embodiments, in response to determining that the threshold number of inversions have been performed on the received code (e.g., "YES" at 1509), the decoder may proceed to 1513 and may declare a decoding failure. Additionally, the decoder may determine that the received code may have more than five errors. Alternatively, in response to determining that the threshold number of inversions have not been performed on the received code (e.g., "NO" at 1509), the decoder may proceed to 1515.

At 1515, the decoder may update the inverted code by inverting a next bit of the cyclic code. Additionally, the inverted code may be updated by reversing the inversion performed during a previous iteration of process 1500 (e.g., by converting the inverted bit back to the first bit). In some embodiments, the decoder may identify a bit of the received code associated with a particular reliability score as being the next bit. More particularly, for example, the particular reliability score may the second lowest reliability score, the second highest score, or any other reliability score.

Upon performing block 1515, the decoder may loop back to 1507 and may determine whether the updated inverted code have fewer errors than the cyclic code. For example, the decoder may determine whether an error of the cyclic code has been corrected by reverting the next bit.

In some implementations, any suitable computer readable media can be used for storing instructions for performing the functions and/or processes described herein. For example, in some implementations, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as flash memory, electrically programmable read only memory (EPROM), electrically erasable programmable read only memory (EE-PROM), etc.), any suitable media that is not fleeting or devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

The above described steps of the processes of FIGS. 10-15 can be executed or performed in any order or sequence not limited to the order and sequence shown and described in the figures. Also, some of the above steps of the processes of FIGS. 10-15 can be executed or performed substantially simultaneously where appropriate or in parallel to reduce latency and processing times.

Although the invention has been described and illustrated in the foregoing illustrative implementations, it is understood that the present disclosure has been made only by way of example, and that numerous changes in the details of implementation of the invention can be made without departing from the spirit and scope of the invention, which is limited only by the claims that follow. Features of the disclosed implementations can be combined and rearranged in various ways.

The invention claimed is:

1. A method for decoding a cyclic code; comprising:
receiving the cyclic code from a channel;
determining a plurality of syndromes for the cyclic code;
determining; by a hardware processor, a first coefficient and a second coefficient based on the plurality of syndromes, wherein the plurality of syndromes comprises one or more known syndromes and one or more unknown syndromes, and wherein the second coefficient is determined without using the one or more unknown syndromes;

determining, by the hardware processor, a third coefficient based on the second coefficient;
generating an error-locator based on the first coefficient, the second coefficient, and the third coefficient;
performing one or more bit inversions on the cyclic code to generate an inverted code;
decoding the cyclic code based on the error-locator and the inverted code; and
transmitting the decoded cyclic code to a sink device.

2. The method of claim 1, wherein the cyclic code is a Quadratic Residue code.

3. The method of claim 1, wherein the one or more known syndromes are associated with a set of indices of the cyclic code, and wherein the one or more unknown syndromes are not associated with the set of indices of the cyclic code.

4. The method of claim 1, further comprising:
determining a number of roots of the error-locator; and
determining a number of errors in the cyclic code based on the number of roots of the error-locator.

5. The method of claim 1, wherein performing one or more bit inversions on the cyclic code to generate an inverted code includes:
performing a first inversion on the cyclic code by inverting a first bit of the cyclic code to generate an inverted code; and
determining whether the first inversion has corrected an error in the cyclic code.

6. The method of claim 5, wherein determining whether the first inversion has corrected an error in the cyclic code comprises determining whether the inverted code comprises fewer errors than the cyclic code.

7. The method of claim 5, further comprising in response to determining that the first inversion has not corrected the error in the cyclic code, determining whether a threshold number of inversions have been performed on the cyclic code.

8. The method of claim 7, further comprising in response to determining that the threshold number of inversions have not been performed on the cyclic code, performing a second inversion on the cyclic code.

9. The method of claim 8, wherein the first bit is associated with a first reliability score.

10. A system for decoding a cyclic code, comprising:
a memory; and
a processor operatively coupled to the memory, the processor is directed to cause the system to perform operations including:
receiving the cyclic code from a channel;
determining a plurality of syndromes for the cyclic code;
determining a first coefficient and a second coefficient based on the plurality of syndromes, wherein the plurality of syndromes comprises one or more known syndromes and one or more unknown syndromes, and wherein the second coefficient is determined without using unknown syndromes;
determining a third coefficient based on the second coefficient;
generating an error-locator based on the first coefficient; the second coefficient, and the third coefficient;
performing one or more bit inversions on the cyclic code to generate an inverted code;
decoding the cyclic code based on the error-locator and the inverted code; and
transmitting the decoded cyclic code to a sink device.

11. The system of claim 10, wherein the cyclic code is a Quadratic Residue code.

12. The system of claim 10, wherein the one or more known syndromes are associated with a set of indices of the cyclic code, and wherein the one or more unknown syndromes are not associated with the set of indices of the cyclic code.

13. The system of claim 11, wherein the processor is further directed to cause the system to perform operations including:
determining a number of roots of the error-locator; and
determining a number of errors in the cyclic code based on the number of roots of the error-locator.

14. The system of claim 11, wherein the processor is further directed to cause the system to perform operations including:
performing a first inversion on the cyclic code by inverting a first bit of the cyclic code to generate an inverted code; and
determining whether the first inversion has corrected an error in the cyclic code.

15. The system of claim 14, wherein, the determining whether the first inversion has corrected an error in the cyclic code includes determining whether the inverted code comprises fewer errors than the cyclic code.

16. The system of claim 14, wherein the processor is further directed to cause the system to perform operations including determining whether a threshold number of inversions have been performed on the cyclic code, in response to determining that the first inversion has not corrected the error in the cyclic code.

17. The system of claim 16, wherein the processor is further directed to cause the system to perform operations including: in response to determining that the threshold number of inversions have not been performed on the cyclic code, performing a second inversion on the cyclic code.

18. The system of claim 17, wherein the first bit is associated with a first reliability score.

19. A non-transitory computer-readable medium storing instructions for decoding a cyclic code which, when executed, cause a processor to perform operations including:
receiving the cyclic code from a channel;
determining a plurality of syndromes for the cyclic code;
determining a first coefficient and a second coefficient based on the plurality of syndromes, wherein the plurality of syndromes comprises one or more known syndromes and one or more unknown syndromes, and wherein the second coefficient is determined without using the one or more unknown syndromes;
determining a third coefficient based on the second coefficient;
generating an error-locator based on the first coefficient, the second coefficient, and the third coefficient;
performing one or more bit inversions on the cyclic code to generate an inverted code;
decoding the cyclic code based on the error-locator and the inverted code; and
transmitting the decoded cyclic code to a sink device.

20. The method of claim 1, wherein the cyclic code is a (71, 36, 11) code.

* * * * *